US012628349B2

(12) United States Patent
Hoang et al.

(10) Patent No.: US 12,628,349 B2
(45) Date of Patent: May 12, 2026

(54) PROTECTION OF CHANNEL LAYER IN THREE-TERMINAL VERTICAL MEMORY STRUCTURE

(71) Applicant: Lam Research Corporation, Fremont, CA (US)

(72) Inventors: John Hoang, Fremont, CA (US);
Meihua Shen, Fremont, CA (US);
Thorsten Bernd Lill, Kalaheo, HI
(US); Hui-Jung Wu, Pleasanton, CA
(US); Aaron Lynn Routzahn, Fremont,
CA (US); Francis Sloan Roberts,
Portland, OR (US)

(73) Assignee: Lam Research Corporation, Fremont, CA (US)

( * ) Notice: Subject to any disclaimer, the term of this patent is extended or adjusted under 35 U.S.C. 154(b) by 520 days.

(21) Appl. No.: 17/905,200

(22) PCT Filed: Mar. 1, 2021

(86) PCT No.: PCT/US2021/020283
§ 371 (c)(1),
(2) Date: Aug. 29, 2022

(87) PCT Pub. No.: WO2021/178309
PCT Pub. Date: Sep. 10, 2021

(65) Prior Publication Data
US 2023/0143057 A1 May 11, 2023

Related U.S. Application Data

(60) Provisional application No. 62/985,236, filed on Mar. 4, 2020.

(51) Int. Cl.
*H10B 51/20* (2023.01)
*H10B 51/30* (2023.01)

(52) U.S. Cl.
CPC ............. *H10B 51/20* (2023.02); *H10B 51/30* (2023.02)

(58) Field of Classification Search
CPC .. H10D 30/5757; H10D 30/00; H10D 30/693; H10D 30/0413; H10D 30/0415;
(Continued)

(56) References Cited

U.S. PATENT DOCUMENTS

2010/0155810 A1    6/2010   Kim et al.
2015/0072488 A1    3/2015   Chien et al.
(Continued)

FOREIGN PATENT DOCUMENTS

KR      20100075098 A      7/2010
KR      20190063419 A      6/2019
(Continued)

OTHER PUBLICATIONS

JP Office Action dated Dec. 3, 2024 in JP Application No. 2022-552716 with English translation.
(Continued)

*Primary Examiner* — Suberr L Chi
(74) *Attorney, Agent, or Firm* — Weaver Austin Villeneuve & Sampson LLP

(57) ABSTRACT

Channel material is conformally deposited along sidewalls of one or more etched features of a mold stack in fabricating a three-terminal memory device. The channel material is deposited in recessed regions and non-recessed regions of the one or more etched features. A sacrificial liner is deposited on the channel material. A directional etch removes the sacrificial liner from non-recessed regions of the one or more etched features. An isotropic etch removes the channel material from non-recessed regions of the one or more etched features, leaving the channel material and the sacrificial liner intact in the recessed regions. The sacrificial liner
(Continued)

500 is removed, leaving the channel material intact and isolated with minimal loss of channel material from over-etch.

13 Claims, 11 Drawing Sheets

(58) Field of Classification Search
CPC ...... H10D 30/701; H10B 51/20; H10B 51/30; H10B 43/27; H10B 43/35
See application file for complete search history.

(56) References Cited

U.S. PATENT DOCUMENTS

| | | | |
|---|---|---|---|
| 2015/0318295 A1 | 11/2015 | Kai et al. | |
| 2016/0163558 A1* | 6/2016 | Hudson | H01L 21/31116 |
| | | | 156/345.24 |
| 2017/0084696 A1 | 3/2017 | Lee et al. | |
| 2017/0092371 A1* | 3/2017 | Harari | H10D 30/693 |
| 2017/0358599 A1 | 12/2017 | Ramaswamy et al. | |
| 2018/0006041 A1* | 1/2018 | Xu | H10D 30/693 |
| 2018/0366489 A1 | 12/2018 | Harari et al. | |
| 2019/0043875 A1* | 2/2019 | Parat | H10B 43/27 |
| 2019/0074363 A1* | 3/2019 | Zhu | H10D 30/63 |
| 2019/0148393 A1 | 5/2019 | Lue | |
| 2019/0355747 A1 | 11/2019 | Herner et al. | |
| 2020/0020718 A1 | 1/2020 | Harari et al. | |
| 2020/0157422 A1* | 5/2020 | Liu | H10D 64/017 |
| 2021/0013224 A1* | 1/2021 | Purayath | H01L 21/76877 |
| 2021/0193660 A1* | 6/2021 | Purayath | H01L 21/31116 |

FOREIGN PATENT DOCUMENTS

| | | | |
|---|---|---|---|
| KR | 20200015743 A | 2/2020 | |
| WO | WO-2016018412 A1 | 2/2016 | |
| WO | WO-2018236937 A1 | 12/2018 | |
| WO | WO-2019133534 A1 | 7/2019 | |

OTHER PUBLICATIONS

TW Office Action dated Oct. 23, 2024 in TW Application No. 110107513 with English translation.
International Preliminary Report on Patentability and written opinion dated Sep. 15, 2022, in PCT Application No. PCT /US2021/ 020283.
International Search Report and Written Opinion dated Jun. 21, 2021, in Application No. PCT/US2021/020283.
JP Office Action dated May 7, 2025 in JP Application No. 2022-552716, with English Translation.
KR Office Action dated Mar. 11, 2025 in KR Application No. 10-2022-7034528, with English Translation.
TW Office Action dated May 9, 2025 in TW Application No. 110107513, with English Translation.
TW Notice of Allowance and Search Report dated Feb. 12, 2026 in TW Application No. 110107513, with English translation.

* cited by examiner

210

215     216
        217
        218
214
212     213
211

220

225     226
        227
        228
224
222     223
221

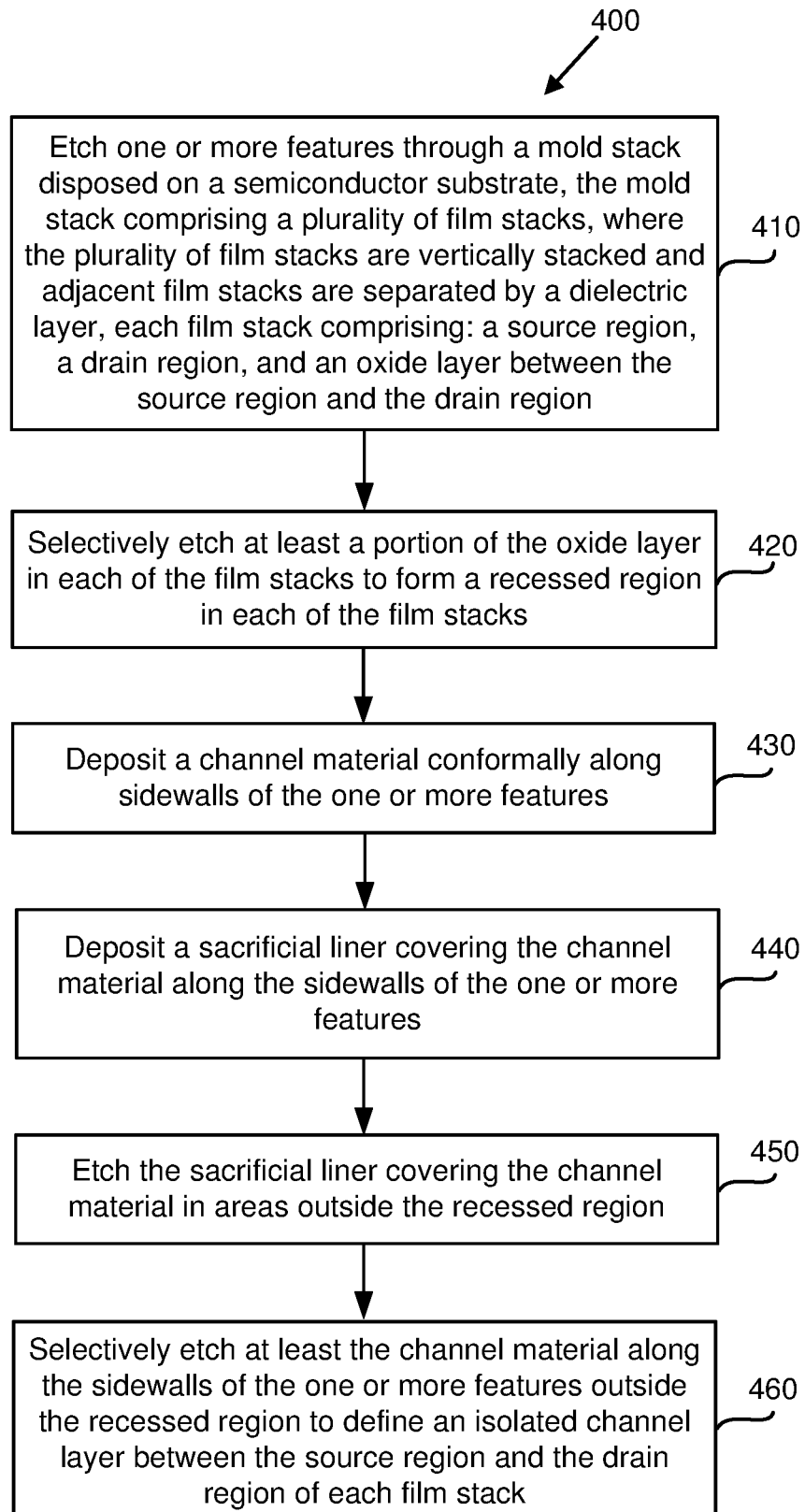

400

Etch one or more features through a mold stack disposed on a semiconductor substrate, the mold stack comprising a plurality of film stacks, where the plurality of film stacks are vertically stacked and adjacent film stacks are separated by a dielectric layer, each film stack comprising: a source region, a drain region, and an oxide layer between the source region and the drain region     410

Selectively etch at least a portion of the oxide layer in each of the film stacks to form a recessed region in each of the film stacks     420

Deposit a channel material conformally along sidewalls of the one or more features     430

Deposit a sacrificial liner covering the channel material along the sidewalls of the one or more features     440

Etch the sacrificial liner covering the channel material in areas outside the recessed region     450

Selectively etch at least the channel material along the sidewalls of the one or more features outside the recessed region to define an isolated channel layer between the source region and the drain region of each film stack     460

FIGURE 4

PROTECTION OF CHANNEL LAYER IN THREE-TERMINAL VERTICAL MEMORY STRUCTURE

INCORPORATION BY REFERENCE

A PCT Request Form is filed concurrently with this specification as part of the present application. Each application that the present application claims benefit of or priority to as identified in the concurrently filed PCT Request Form is incorporated by reference herein in its entirety and for all purposes.

BACKGROUND

Advances in semiconductor device fabrication have led to an increased number of memory devices on a chip. Not only have advancements been made to scale to smaller and smaller features for greater density, but advancements have been made to arrange memory devices from two-dimensional (2-D) architectures to three-dimensional (3-D) architectures. In 2-D memories, memory cells are arranged side by side on a single die layer. In 3-D memories, more planes of memory cells can stack over one another in a given footprint on limited die size, which can lead to increased capacity and performance.

The background provided herein is for the purposes of generally presenting the context of the disclosure. Work of the presently named inventors, to the extent that it is described in this background, as well as aspects of the description that may not otherwise qualify as prior art at the time of filing, are neither expressly nor impliedly admitted as prior art against the present disclosure.

SUMMARY

Certain embodiments herein relate to a method of forming an isolated channel layer for a vertically integrated memory array. The method includes: (i) etching one or more features through a mold stack, where the mold stack is disposed on a semiconductor substrate, the mold stack comprising a plurality of film stacks, where the plurality of film stacks is vertically stacked and adjacent film stacks are separated by a dielectric layer, each film stack comprising: a source region, a drain region, and an oxide layer between the source region and the drain region. The method further includes (ii) selectively etching at least a portion of the oxide layer in each of the film stacks to form a recessed region in each of the film stacks, (iii) depositing a channel material conformally along sidewalls of the one or more features, (iv) depositing a sacrificial liner covering the channel material along the sidewalls of the one or more features, (v) etching the sacrificial liner covering the channel material in areas outside the recessed region, and (vi) selectively etching at least the channel material along the sidewalls of the one or more features outside the recessed region to define an isolated channel layer between the source region and the drain region of each film stack.

In some implementations, the method further includes (vii) removing, after selectively etching at least the channel material outside the recessed region, the sacrificial liner overlying the isolated channel layer. In some implementations, the isolated channel layer has topographical deviations no greater than about 10% from a reference surface after removing the sacrificial liner. In some implementations, each film stack further comprises a conductor layer adjacent to the drain region and sandwiched between the drain region and the dielectric layer, where the dielectric layer serves to electrically isolate the adjacent film stacks from one another. In some implementations, etching the sacrificial liner in the areas outside the recessed region comprises directionally etching the sacrificial liner at an etch contrast of at least 10:1 relative to the channel material. In some implementations, protrusions from the sidewalls of the one or more features serve as a mask to protect the recessed region during the directional etching of the sacrificial liner. In some implementations, selectively etching at least the channel material in the areas outside the recessed region comprises isotropically etching the channel material at an etch contrast of at least 25:1 relative to the sacrificial liner. In some implementations, isotropically etching the channel material occurs at an etch contrast of at least 10:1 relative to at least the dielectric layer. In some implementations, the sacrificial liner is conformally deposited on the channel material along the sidewalls of the one or more features.

Another aspect of the disclosed embodiments relates to a memory device. The memory device includes (i) a plurality of three-terminal memory cells, each memory cell comprising: a source terminal connected to a source region, a drain terminal connected to a drain region, an oxide layer between the source region and the drain region, an isolated channel layer on a surface of the oxide layer and providing interconnection between the source region and the drain region, a gate terminal, and a memory film between the isolated channel layer and the gate terminal. The memory device further includes (ii) a plurality of dielectric layers each separating adjacent three-terminal memory cells, where the plurality of three-terminal memory cells is vertically stacked.

In some implementations, the plurality of three-terminal memory cells comprises greater than 20 three-terminal memory cells. In some implementations, the isolated channel layer comprises polysilicon. In some implementations, the isolated channel layer of a first memory cell is insulated from a second memory cell that is adjacent to the first memory cell. In some implementations, the memory film includes a ferroelectric layer, a charge trap layer, or spin-orbit torque memory stack. In some implementations, the isolated channel layer is positioned in a recessed region of the oxide layer, where the recessed region is defined by a portion of the oxide layer laterally recessed relative to sidewalls of one or more of the source region, the drain region, and the plurality of dielectric layers.

BRIEF DESCRIPTION OF THE DRAWINGS

FIG. 4 illustrates a flow diagram of an example method of forming a channel layer during fabrication of a vertically integrated three-terminal memory array according to some implementations.

DETAILED DESCRIPTION

In the present disclosure, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication. A wafer or substrate used in the semiconductor device industry typically has a diameter of 200 mm, or 300 mm, or 450 mm. The following detailed description assumes the present disclosure is implemented on a wafer. However, the present disclosure is not so limited. The work piece may be of various shapes, sizes, and materials. In addition to semiconductor wafers, other work pieces that may take advantage of the present disclosure include various articles such as printed circuit boards and the like.

INTRODUCTION

High-density, high-capacity memory has been a major facilitator in widespread proliferation of portable electronic devices. As electronic devices shrink, strategies for fabricating complex, efficient, and multiple memory cells are employed to maximize density of memory cells in a memory device. 3-D memory architectures address challenges associated with 2-D memory architectures by stacking memory cells vertically. However, 3-D memory architectures have largely been limited to two-terminal memory devices. As used herein, a two-terminal memory device refers to a memory device having no more than two explicit local terminals. For instance, a memory device can have an input terminal (e.g., wordline) and an output terminal (e.g., bitline).

Various approaches exist for vertically integrating memory cells in high-density memory arrays with respect to 2-D memory architectures. One approach is by arranging memory cells in a cross-point array configuration. Generally, a cross-point array refers to a memory array having memory cells disposed and electrically connected at intersections between a first set of conductive lines (e.g., wordlines) and a second set of conductive lines (e.g., bitlines) overlapping and crossing the first set of conductive lines.

Figure 1A:
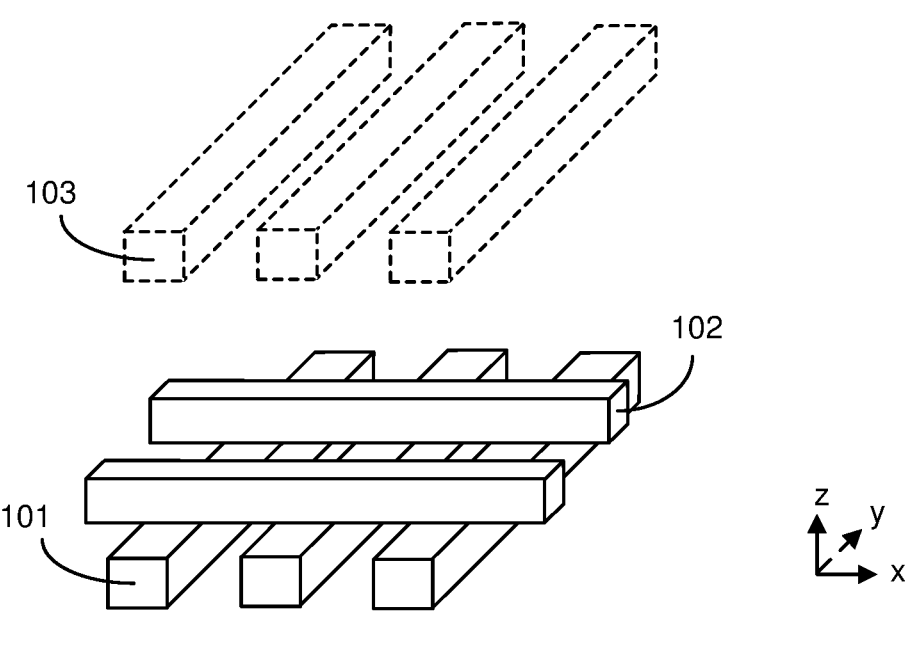
FIG. 1A shows a schematic illustration of an example fabrication approach for a vertically integrated two-terminal memory array in an x-y cross-point architecture.

FIG. 1A shows a schematic illustration of an example fabrication approach for a vertically integrated two-terminal memory array in an x-y cross-point architecture. A first set of conductive lines 101 extend in a y-direction and a second set of conductive lines 102 extend in an x-direction. The second set of conductive lines 102 is above the first set of conductive lines 101. The conductive lines 101/102 are conductors configured to carry electrical signals such as, for example, a voltage or current pulse, between memory cells. Though not shown in FIG. 1A, the first set of conductive lines 101 may be separated from the second set of conductive lines 102 by one or more active elements and/or one or more isolation layers that form part of each memory cell. To scale up the two-terminal memory array in an x-y cross-point architecture, repeating conductive lines 103 may be stacked above the second set of conductive lines 102. In other words, another set of conductive lines may extend in the y-direction and another set of conductive lines may extend in the x-direction over the first and second conductive lines 101/102. Each pair of conductive lines extending in the x-direction and the y-direction form a deck. Though fabrication of a vertically integrated two-terminal memory array in an x-y cross-point architecture may be advantageous for low aspect ratio etching and for critical dimensions scalable to 10 nm, fabrication of the vertically integrated two-terminal memory array in an x-y cross-point architecture may be cost prohibitive, especially beyond 4 decks or beyond 6 decks. For example, to lithographically pattern and fabricate each deck, two or more etch steps and two or more deposition steps may be required, which makes scaling up the vertically integrated two-terminal memory array cost-prohibitive.

Figure 1B:
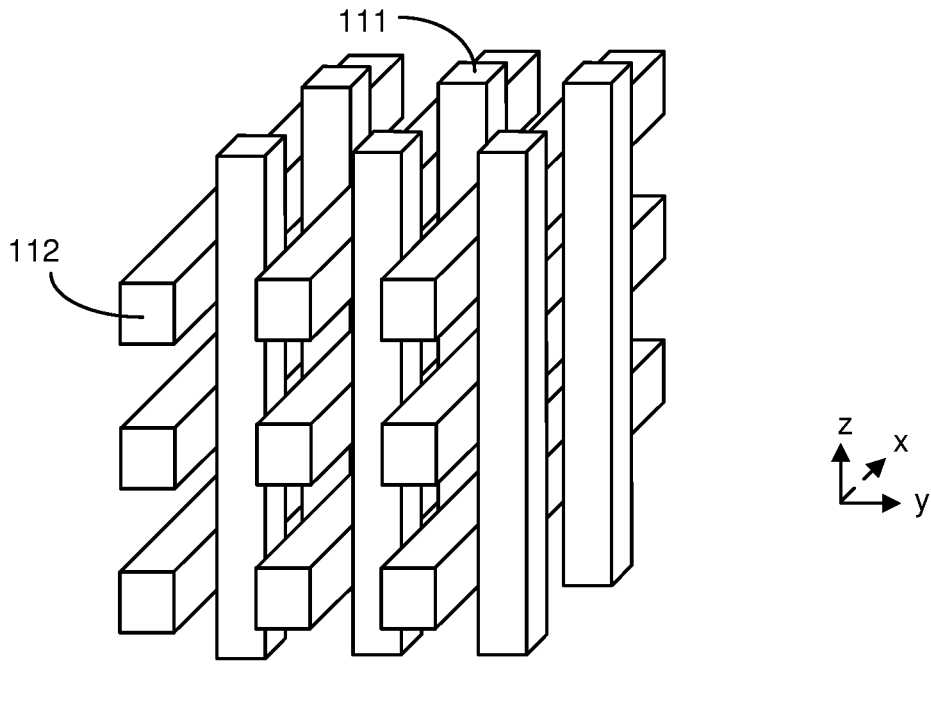
FIG. 1B shows a schematic illustration of an example fabrication approach for a vertically integrated two-terminal memory array in an x-z cross-point architecture.

FIG. 1B shows a schematic illustration of an example fabrication approach for a vertically integrated two-terminal memory array in an x-z cross-point architecture. A set of vertical conductive lines 111 extend in a z-direction and a set of horizontal conductive lines 112 extend perpendicularly with respect to the first set of vertical conductive lines 111. Here, the set of horizontal conductive lines 112 extends in an x-direction, though it will be understood that the set of horizontal conductive lines 112 may extend in a y-direction. The vertical conductive lines 111 and the horizontal conductive lines 112 are interleaved to form a grid pattern (i.e., rows and columns). The conductive lines 111/112 are conductors configured to carry electrical signals such as, for example, a voltage or current pulse, between memory cells. Though not shown in FIG. 1B, the vertical conductive lines 111 may be separated from the horizontal conductive lines 112 by one or more active elements and/or one or more isolation layers that form part of each memory cell. To scale up the two-terminal memory array in an x-z cross-point architecture, multiple rows and columns may be added to provide more memory cells. The number of rows or the number of columns may correspond to the number of decks. Though fabrication of a vertically integrated two-terminal memory array in an x-z cross-point architecture may result in a cost that scales down with the number of decks, such fabrication may be limited by challenges associated with vertical line etching and the risk of pattern collapse with stack etch. This can limit the number of decks to be equal to or less than about 5 decks. To lithographically pattern and fabricate the memory array in an x-z cross-point architecture, two etch steps and two deposition steps may be required.

Figure 1C:
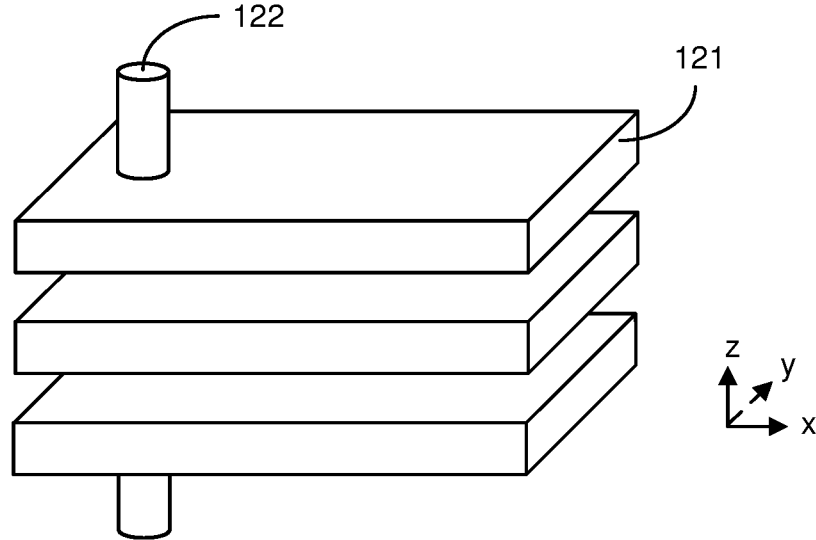
FIG. 1C shows a schematic illustration of an example fabrication approach for a vertically integrated two-terminal memory array in a 3-D vertical stacking architecture.

FIG. 1C shows a schematic illustration of an example fabrication approach for a vertically integrated two-terminal memory array in a 3-D vertical stacking architecture. A set of horizontal conductive lines 121 may be provided as a series of stacks in an x-direction and y-direction, and one or more vertical conductive lines 122 may be provided that extend in a z-direction. Rather than having multiple lithography steps for each layer, one or more holes/recesses may be formed through all the layers at once, and the one or more holes/recesses may be filled with concentric layers. Scaling up the vertically integrated two-terminal memory array in a 3-D vertical stacking architecture can occur by adding more horizontal conductive lines 121. A density of the vertically integrated two-terminal memory array may be increased by adding more vertically conductive lines 122. The conductive lines 121/122 are conductors configured to carry electrical signals such as, for example, a voltage or current pulse, between memory cells. Though not shown in FIG. 1C, the horizontal conductive lines 121 may be separated from the vertical conductive lines 122 by one or more active elements and/or one or more isolation layers that form part of each memory cell. For example, a memory cell can include concentric layers of a switching layer and selection layer that wrap around portions of the vertically conductive lines 122. Fabrication of a vertically integrated two-terminal memory array in a 3-D vertical stacking architecture may result in reduced cost and enable tens or hundreds of decks when scaling up. However, such fabrication may be limited by challenges associated with high aspect ratio etching and conformal deposition of film layers along sidewalls. To pattern and fabricate the memory array in a 3-D vertical stacking architecture, only one etch step and one deposition step may be required.

The present disclosure relates to three-terminal memory devices rather than two-terminal memory devices. For example, a three-terminal memory device may have two input terminals and a single output terminal. A typical two-terminal memory device may include a source/drain terminal and a gate terminal. Many existing 3-D NAND memory devices are two-terminal memory devices with a common source/drain terminal (i.e., having the source/drain terminals connected to each other). A typical three-terminal memory device may include a source terminal, a drain terminal, and a gate terminal. The source terminal, the drain terminal, and the gate terminal are each connected separately and may be accessed separately in a memory device.

Figure 2A:
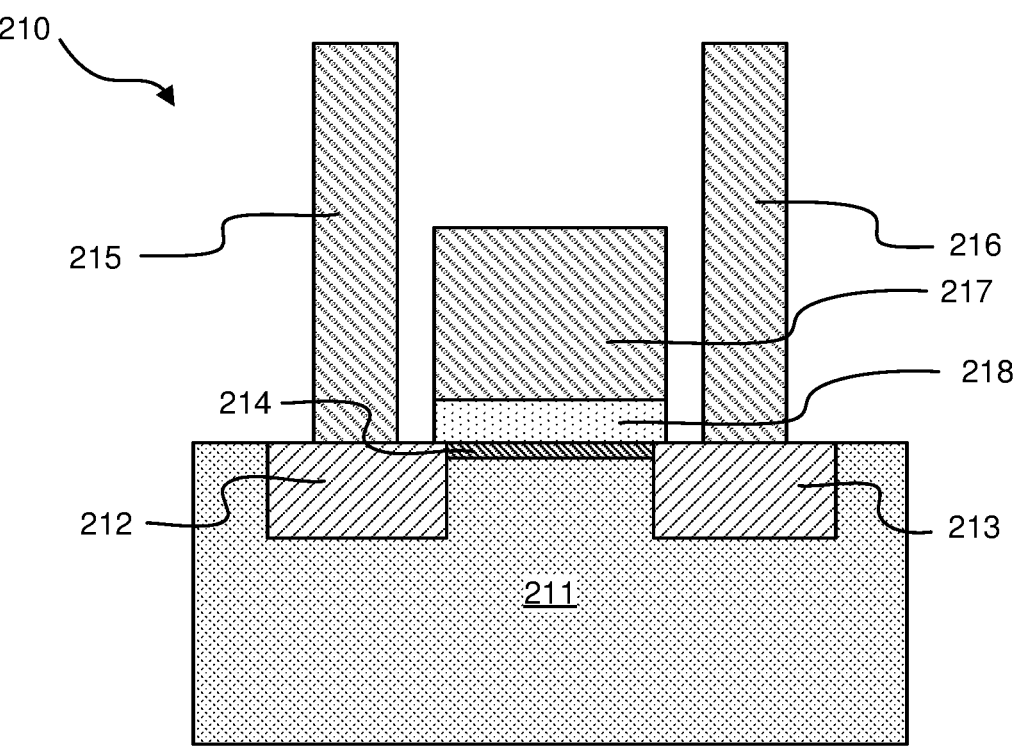
FIG. 2A shows a schematic diagram of an example three-terminal memory device with a ferroelectric layer.
Figure 2B:
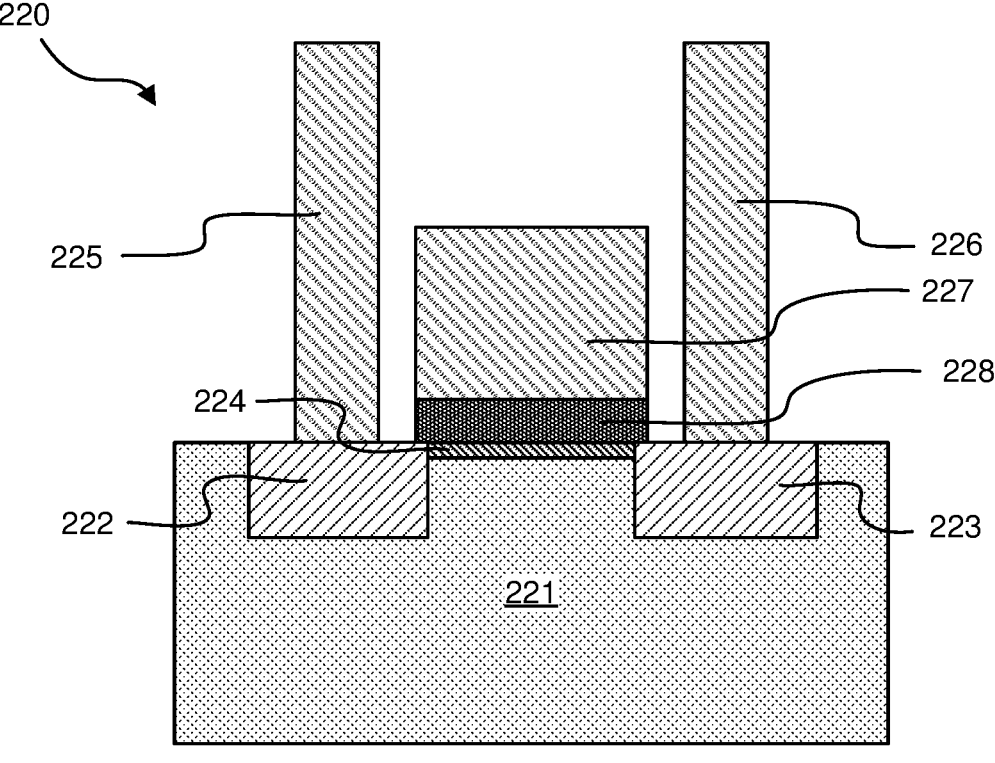
FIG. 2B shows a schematic diagram of an example three-terminal memory device with a charge trap layer.
Figure 2C:
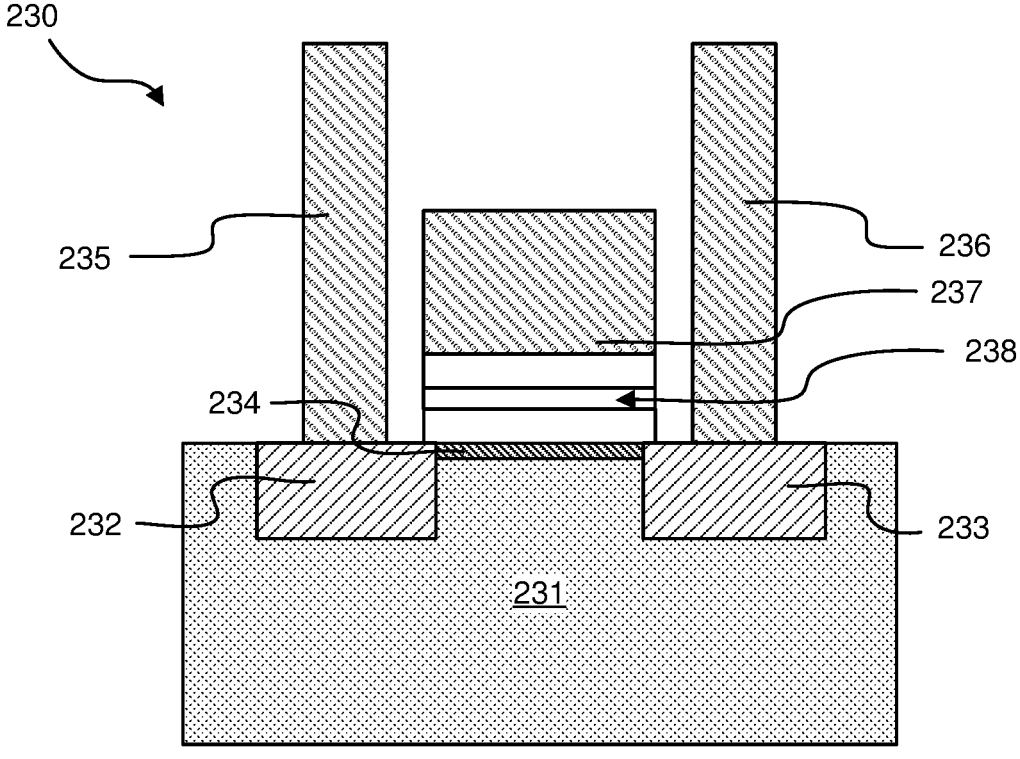
FIG. 2C shows a schematic diagram of an example three-terminal memory device with a spin-orbit torque (SOT) memory stack.

Various types of three-terminal memory devices may be implemented in the present disclosure. Non-volatile memory retains its stored memory even when not powered. Many different types of non-volatile memory include transistors, where the gate is electrically isolated. There may be different methods for charging the gate. FIGS. 2A-2C illustrate different examples of planar three-terminal memory devices having source, drain, and gate terminals.

FIG. 2A shows a schematic diagram of an example three-terminal memory device with a ferroelectric layer. A planar memory device 210 includes an active layer 211, where the active layer 211 includes a source region 212, a drain region 213, and a channel region 214. The channel region 214 can include a semiconducting material that permits electrons to flow between the source region 212 and the drain region 213. A source terminal 215 is connected to the source region 212 and a drain terminal 216 is connected to the drain region 213. A gate terminal 217 is disposed over the channel region 214, where a ferroelectric layer 218 is sandwiched between the gate terminal 217 and the channel region 214. A ferroelectric layer 218 includes a ferroelectric material that can have two distinct polarization states, and the ferroelectric layer 218 can be characterized by reversible spontaneous polarization in the absence of an electric field. The spontaneous polarization of ferroelectric materials implies a hysteresis effect, which can be used as a memory function in making ferroelectric RAM (FeRAM).

FIG. 2B shows a schematic diagram of an example three-terminal memory device with a charge trap layer. A planar memory device 220 includes an active layer 221, where the active layer 221 includes a source region 222, a drain region 223, and a channel region 224. The channel region 224 can include a semiconducting material that permits electrons to flow between the source region 222 and the drain region 223. A source terminal 225 is connected to the source region 222 and a drain terminal 226 is connected to the drain region 223. A gate terminal 227 is disposed over the channel region 224, where a charge trap layer 228 is sandwiched between the gate terminal 227 and the channel region 224. A charge trap layer 228 includes an insulating film to store electrons rather than a metallic or semiconducting film. The insulating film may include a material such as silicon nitride, where the charge trap layer 228 uses a variable charge between the gate terminal 227 and the channel region 224 to change the threshold voltage of the planar memory device 220. The charge trap layer 228 may be used to create non-volatile memory in NOR and NAND flash memory.

FIG. 2C shows a schematic diagram of an example three-terminal memory device with a spin-orbit torque memory stack. A planar memory device 230 includes an active layer 231, where the active layer 231 includes a source region 232, a drain region 233, and a channel region 234. The channel region 234 can include a semiconducting material that permits electrons to flow between the source region 232 and the drain region 233. A source terminal 235 is connected to the source region 232 and a drain terminal 236 is connected to the drain region 233. A gate terminal 237 is disposed over the channel region 234, where a spin-orbit torque (SOT) memory stack 238 is sandwiched between the gate terminal 237 and the channel region 234. Similar to spin-transfer torque (STT), spin-orbit torque relies on the use of spin-polarized current applied to a magnetic tunnel junction to switch a magnetic state. The spin-orbit torque memory stack 238 includes the magnetic tunnel junction, where the magnetic tunnel junction includes at least two ferromagnetic layers separated by a non-magnetic insulator. A first ferromagnetic layer includes a reference layer designed to serve as a free magnetic layer, and a second ferromagnetic layer is designed to have a fixed magnetization direction. In the three-terminal planar memory device 230, the reference layer of the spin-orbit torque memory stack 238 is on top of a conductor that serves as a metal electrode write line. The spin-orbit torque memory stack 238 may be used to create non-volatile memory in magnetic RAM (MRAM) that may have higher performance capabilities than typical spin-transfer torque MRAM.

Implementations of FeRAM, NOR flash memory, NAND flash memory, or spin-orbit torque RAM shown in FIGS. 2A-2C are illustrative only and are not intended to be limiting in the present disclosure. It will be understood that the present disclosure may include other three-terminal memory devices known in the art and not illustrated in FIGS. 2A-2C. Nonetheless, such three-terminal memory devices in the present disclosure may include at least a channel layer or channel region providing electron flow between a source terminal and a drain terminal.

As discussed above, two-terminal memory devices may be arranged in a 3-D memory array. Examples of vertically integrated 3-D memory arrays include x-y cross-point architecture, x-z cross-point architecture, and 3-D vertical stacking architecture. Three-terminal memory devices provide more terminals and offer broader applications than two-terminal memory devices. However, many challenges exist in fabricating or otherwise implementing three-terminal memory devices in a 3-D memory array.

Protection of Channel Layer in Three-Terminal Memory Device Fabrication

The present disclosure relates to vertical integration of three-terminal memory devices in a 3-D vertical stacking architecture. Arranging three-terminal memory cells in a 3-D vertical stacking architecture provides the benefits of reduced cost along with being able to fabricate tens or hundreds of decks when scaling up. However, etching and deposition of films can become increasingly difficult and/or non-uniform at higher aspect ratios, thereby resulting in fabrication challenges in vertically integrated three-terminal memory devices. Specifically, fabrication of channel layers in vertically integrated three-terminal memory devices in a 3-D vertical stacking architecture may result in electrical shorting and/or damage. Electrical shorting may occur by unwanted electrical interconnection due to non-isolated channel layers in electrical contact with adjacent memory cells. If memory cells in a 3-D memory array are not electrically isolated from one another, then electrical shorting results. Damage to a channel layer may result from over-etching portions of the channel layer that lead to topographical differences and discontinuities along the channel layer, thereby reducing performance. For instance, over-etch that results in 10% loss of channel material or less may be considered negligible damage, whereas over-etch that results in greater than 10% loss of channel material may be considered moderate to significant damage. Over-etch that results in greater than 30% loss of channel material may be considered significant damage. Such damage can have a significant impact in the performance of 3-D memory arrays.

Figure 3:
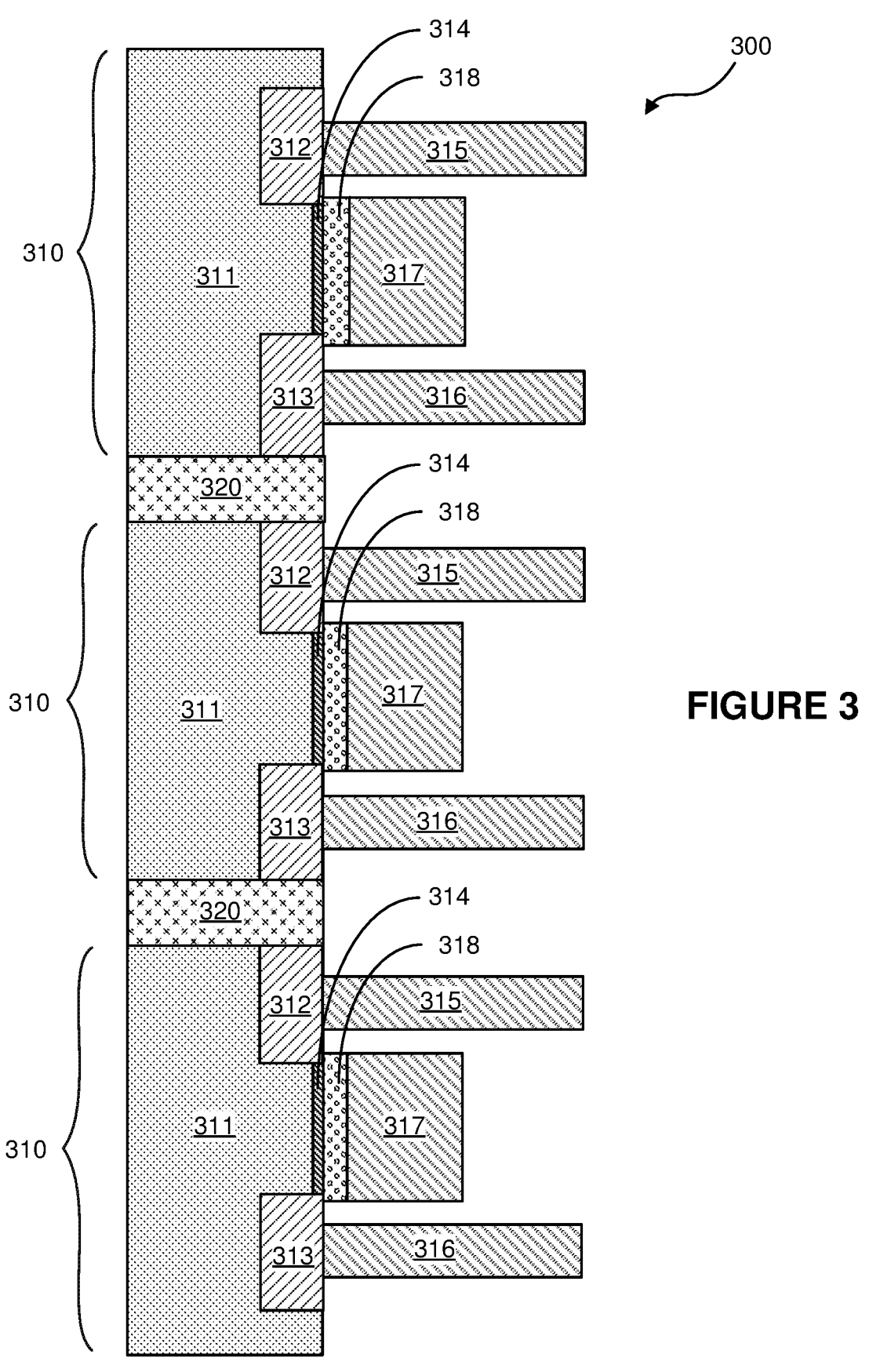
FIG. 3 shows a schematic diagram of an example vertically integrated three-terminal memory array according to some implementations.

FIG. 3 shows a schematic diagram of an example vertically integrated three-terminal memory array according to some implementations. A vertically integrated three-terminal memory array 300 is arranged in a 3-D vertical stacking architecture. Though illustrated in 2-D, it will be understood that layers and components depicted in the vertically integrated three-terminal memory array 300 may extend into and out of the page. The vertically integrated three-terminal memory array 300 includes a plurality of three-terminal memory cells 310. The plurality of three-terminal memory cells 310 may be vertically stacked over one another in a 3-D vertical stacking arrangement. In some implementations, the plurality of three-terminal memory cells 310 includes greater than 10 three-terminal memory cells, greater than 20 three-terminal memory cells, or greater than 30 three-terminal memory cells. Each of the plurality of three-terminal memory cells 310 is electrically isolated from one another. In some implementations, a plurality of electrically insulating layers 320 each separate adjacent three-terminal memory cells 310 from one another. Each of the plurality of electrically insulating layers 320 may include an electrically insulating material such as silicon dioxide, silicon oxycarbide, silicon nitride, silicon oxynitride, silicon carbide, or silicon oxycarbonitride. In some implementations, the plurality of electrically insulating layers 320 may also be referred to as the plurality of dielectric layers.

Each three-terminal memory cell 310 includes an oxide layer 311, a source region 312, a drain region 313, a channel layer 314, source terminal 315, a drain terminal 316, a gate terminal 317, and a memory film 318. In some implementations, the source region 312 and the drain region 313 may be formed in the oxide layer 311, where the source region 312 and the drain region 313 may be formed on a certain side of the oxide layer 311. The source region 312 and the drain region 313 may be separated by at least a portion of the oxide layer 311. The source terminal 315 electrically contacts the source region 312 and the drain terminal 316 electrically contacts the drain region 313. The oxide layer 311 is between the source region 312 and the drain region 313. The channel layer 314 spans between the source region 312 and the drain region 313 to permit electron flow between the source terminal 315 and the drain terminal 316. The channel layer 314 may be formed on a surface of the oxide layer 311. A memory film 318 is positioned on the channel layer 314 and a gate terminal 317 is positioned on the memory film 318 so that the memory film 318 is sandwiched between the channel layer 314 and the gate terminal 317. In some implementations, the memory film 318 covers the channel layer 314. The composition of the memory film 318 may depend on the nature of the non-volatile memory of the three-terminal memory cell 310. In some implementations, the memory film 318 may include a ferroelectric layer as shown in FIG. 2A, a charge trap layer as shown in FIG. 2B, or a spin-orbit torque memory stack as shown in FIG. 2C. In some implementations, the channel layer 314 is positioned in a recessed region of the oxide layer 311. The portion of the oxide layer 311 that separates the source region 312 and the drain region 313 may be recessed laterally relative to sidewalls of the source region 312, drain region 313, and/or electrically insulating layers 320 to define the recessed region.

Each of the source terminal 315, the drain terminal 316, and the gate terminal 317 includes an electrically conductive material. In some implementations, the electrically conductive material can include but is not limited to molybdenum, titanium, tantalum, tungsten, aluminum, copper, chromium, zinc, neodymium, platinum, and alloys thereof. For example, the electrically conductive material can include tungsten. In some implementations, the electrically conductive material can include a conductive oxide such as indium tin oxide (ITO) or indium zinc oxide (IZO).

In some implementations, the channel layer 314 has an average thickness equal to or less than about 30 nm, equal to or less than about 20 nm, equal to or less than about 15 nm, or between about 2 nm and about 15 nm. In some implementations, the channel layer 314 includes a semiconductor material. Examples of semiconductor materials in the channel layer 314 include but are not limited to polysilicon (poly-Si), silicon (Si), germanium (Ge), silicon-germanium (Si—Ge), carbon (C), boron nitride (BN), molybdenum disulfide ($MoS_2$), and oxide semiconducting materials such as zinc oxide (ZnO), indium oxide ($In_2O_3$), gallium oxide ($Ga_2O_3$), germanium oxide ($GeO_2$), indium gallium zinc oxide (IGZO), and the like. In some implementations, the channel layer 314 includes polysilicon. The channel layer 314 spans between the source region 312 and the drain region 313 of each memory cell 310. The channel layer 314 is isolated to each memory cell 310, meaning that the channel layer 314 is insulated from (i.e., no direct electrical connection to) any adjacent memory cell 310. For example, the channel layer 314 of a first memory cell is insulated from a second memory cell that is adjacent to a first memory cell. In some implementations, the channel layer 314 is substantially flat or smooth, where a flatter or more even surface can correlate with greater crystallinity. In some implementations, the channel layer 314 can have topographical deviations of no greater than about 10% from a reference surface of the channel layer 314. In some implementations, an average thickness of the channel layer 314 after various etch operations is sufficient for providing electrical interconnection between the source region 312 and the drain region 313, where an average thickness of the channel layer 314 is at least 5 nm. The channel layer 314 of the present disclosure can be isolated with minimal loss of channel material by protecting the channel layer 314 through a series of selective etches and sacrificial liner deposition described below. In some implementations, minimal loss of channel material can be achieved by preserving the channel layer 314 so that an average thickness of the channel layer 314 is at least 5 nm. In some implementations, the channel layer 314 may also be referred to as an isolated channel layer.

In the present disclosure, channel material may be deposited in recessed regions and non-recessed regions of one or more etched features. A sacrificial liner is deposited on the channel material. A directional etch removes the sacrificial liner from non-recessed regions of the one or more etched features, leaving the sacrificial liner in recessed regions of the one or more etched features. An isotropic etch removes the channel material from non-recessed regions of the one or more etched features, leaving the channel material and the sacrificial liner intact in the recessed regions. The sacrificial liner is then removed from the recessed regions, leaving the channel material in the recessed regions intact, isolated, and free of damage from over-etch.

FIG. 4 illustrates a flow diagram of an example method of forming a channel layer during fabrication of a vertically integrated three-terminal memory array according to some implementations. The operations of a process 400 may be performed in different orders and/or with different, fewer, or additional operations. The operations of the process 400 may be performed using an apparatus or tool shown in FIGS. 7 and 8. In some implementations, the operations of the process 400 may be implemented, at least in part, according to software stored in one or more non-transitory computer readable media. The operations of the process 400 may correspond to stages illustrated in FIGS. 5A-5G and 6A-6E, where FIGS. 5A-5G and 6A-6E show cross-sectional schematic illustrations of various stages in an example process of forming a channel layer during fabrication of a vertically integrated memory array according to some implementations.

At block 410 of the process 400, one or more features are etched through a mold stack disposed on a semiconductor substrate. The mold stack includes a plurality of film stacks. The plurality of film stacks is vertically stacked and adjacent films stacks are separated by a dielectric layer. Each film stack includes a source region, a drain region, and an oxide layer between the source region and the drain region. In some implementations, the dielectric layer includes an electrically insulating material such as silicon carbide, silicon oxynitride, or silicon oxycarbide. The dielectric layer serves to separate each film stack from one another. Put another way, the dielectric layer serves to electrically isolate the adjacent film stacks from one another. The plurality of film stacks may comprise multiple repeating film stacks, where a number of the repeating film stacks may be equal to or greater than 5, equal to or greater than 10, equal to or greater than 15, equal to or greater than 25. In some implementations, the oxide layer can include a silicon oxide, silicon oxycarbide, silicon oxynitride, or other suitable electrically insulating oxides. The source region and the drain region may be separated by at least a portion of the oxide layer. In some implementations, the source region and the drain region may be positioned on a certain side of the oxide layer. Each of the source region and the drain region may include a semiconducting material such as doped polysilicon, implanted silicon, epitaxial silicon, or silicon-germanium. In some implementations, each film stack further includes a conductor layer adjacent to the drain region so that the conductor layer is sandwiched between the drain region and the dielectric layer. In some implementations, the conductor layer includes an electrically conductive material such as molybdenum, titanium nitride, or tungsten.

One or more features are etched through the mold stack. "Features" as used herein may refer to "negative features" or "etched features," including but not limited to trenches, holes, vias, gaps, cavities, recessed regions, and the like. These terms may be used interchangeably in the present disclosure. One example of a feature is a trench. A feature typically has an aspect ratio (depth to lateral dimension). A feature having a high aspect ratio can have a depth to lateral dimension aspect ratio equal to or greater than about 10:1, equal to or greater than about 15:1, equal to or greater than about 20:1, equal to or greater than about 25:1, equal to or greater than about 30:1, or equal to or greater than about 50:1.

Figures 5A, 5B, 5C, 5D:
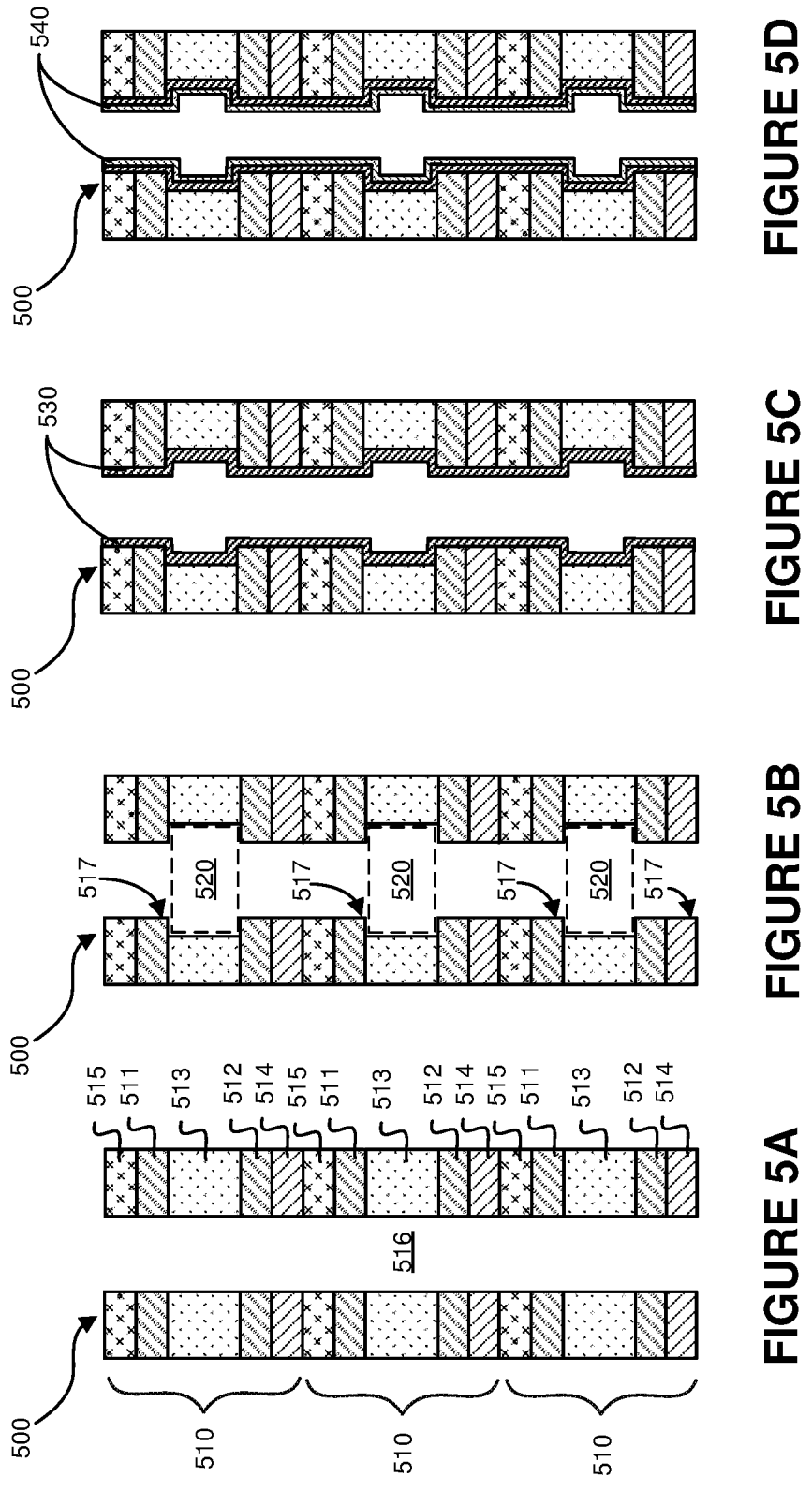
FIGS. 5A-5G show cross-sectional schematic illustrations of various stages in an example process of forming a channel layer during fabrication of a vertically integrated three-terminal memory array according to some implementations.

To etch the one or more features, a mask may be disposed over the mold stack. The mask may be patterned using conventional lithography techniques to define where the one or more features are to be etched. In some implementations, a patterned hardmask or photoresist is positioned over a top surface of the mold stack for defining the one or more features to be etched. In some implementations, a non-selective plasma etch may be performed to etch through the mold stack. The non-selective plasma etch may have a chemistry that etches through the materials of the mold stack at an etch rate that is the same or substantially similar. A reaction chamber used for non-selective plasma etching may be a Flex™ reaction chamber, for example from the 2300® Flex™ product family available from Lam Research Corporation of Fremont, CA FIG. 5A shows a cross-sectional schematic illustration of an etched feature through a mold stack. It will be understood that even though the mold stack 500 shows only three film stacks 510 that repeat identical layers/components, the mold stack 500 can include more than three film stacks 510 in a 3-D vertical stacking architecture. For example, the mold stack 500 can include greater than 15 repeating film stacks 510, greater than 20 repeating film stacks, greater than 30 repeating film stacks, or greater than 50 repeating film stacks.

The mold stack 500 includes a plurality of film stacks 510 each including a source region 511, drain region 512, and an oxide layer 513 between the source region 511 and the drain region 512. The source region 511 and the drain region 512 may have identical or similar compositions. In some implementations, each film stack 510 further includes a conductor layer 514 adjacent to the drain region 512. In some implementations, each film stack 510 further includes a dielectric layer 515 adjacent to the source region 511. Though each film stack 510 shows four different films, assuming that the source region 511 and the drain region 512 are identical, it will be understood that in some implementations each film stack 510 in the mold stack 500 may have three different films or fewer. For example, each film stack 510 may be without a conductor layer 514 or without a dielectric layer 515.

The dielectric layer 515 may serve to electrically isolate the plurality of film stacks 510 from one another. Though the dielectric layer 515 may be described as part of each film stack 510, it will be understood that in some implementations the dielectric layer 515 may be described as separate from the film stack 510 for dividing or separating the film stacks 510 from one another. In FIG. 5A, the dielectric layer 515 is positioned above the source region 511, the source region 511 is positioned above the oxide layer 513, the oxide layer 513 is positioned above the drain region 512, and the drain region 512 is positioned above the conductor layer 514.

By way of an example in FIG. 5A, each of the source region 511 and drain region 512 may include doped polysilicon, the dielectric layer 515 may include silicon oxycarbide, the oxide layer 513 may include silicon oxide, and the conductor layer 514 may include tungsten. Thus, each film stack 510 in the mold stack 500 may include SiOC/doped poly-Si/SiO$_2$/doped poly-Si/W. However, it will be understood that there may be fewer or more films in each film stack 510 in some other implementations.

By way of another example (not shown), each of the source region 511 and drain region 512 may include doped polysilicon, the dielectric layer 515 may include silicon oxycarbide, and the oxide layer 513 may include silicon oxide. Hence, each film stack 510 in the mold stack 500 may include SiOC/doped poly-Si/SiO$_2$/doped poly-Si.

By way of yet another example (not shown), each of the source region 511 and drain region 512 may include silicon nitride, the dielectric layer 515 may include silicon oxycarbide, and the oxide layer 513 may include silicon oxide. Therefore, each film stack 510 in the mold stack 500 may include SiOC/SiN/SiO$_2$/SiN. It will be understood that the silicon nitride may be replaced by a different material such as titanium nitride in subsequent operations. It will be understood that the foregoing configurations are illustrative only and other configurations for the mold stack 500 may be possible.

An etched feature 516 extends through the mold stack 500, including through the dielectric layer 515, the source region 511, the oxide layer 513, the drain region 512, and the conductor layer 514 of each film stack 510. The etched feature 516 may be formed by a vertical etch. In some implementations, the etched feature 516 may be a hole or trench produced by a non-selective plasma etch. In some implementations, the etched feature 516 may have a high aspect ratio. In some implementations, a depth-to-width aspect ratio of the etched features is equal to or greater than about 10:1.

Returning to FIG. 4, at block 420 of the process 400, at least a portion of the oxide layer is selectively etched in each of the film stacks to form a recessed region in each of the film stacks. Oxide material in the oxide layer is selectively etched at a substantially faster rate compared to other materials in the mold stack, or at least compared to the dielectric layer of the mold stack. A substantially faster rate can be at least five times, at least seven times, at least ten times, or at least fifty times greater than the etch rate of the other materials. Thus, the oxide material is selectively etched without etching or substantially etching the other materials in the mold stack, or at least without etching or substantially etching the dielectric layer of the mold stack. When selectively etching the oxide layer, etch proceeds laterally to remove oxide material from the oxide layer. It will be understood that selectively etching the oxide layer may also laterally remove some of the source region and drain region in certain implementations. Selectively etching the oxide layer removes a desired thickness of at least the oxide layer from sidewalls of the one or more features. That way, each iteration of the oxide layer in the one or more features of the mold stack has a gap that is widened relative to the other layers of the mold stack. The widened gap corresponds to the recessed region in each of the film stacks. A channel layer is to be subsequently deposited in the recessed region. In some implementations, a thickness of the oxide layer removed from sidewalls of the one or more features is between about 1 nm and about 30 nm, between about 1 nm and about 20 nm, or between about 1 nm and about 10 nm. The thickness of the oxide layer removed from sidewalls of the one or more features is sufficient to allow at least a channel layer and a sacrificial liner to be deposited in the recessed region.

In some implementations, selectively etching at least a portion of the oxide layer is performed by use of a fluorine-based etchant. Oxide material may be etched with a high selectivity towards the other materials of the mold stack by using a fluorine-based etchant. For example, the fluorine-based etchant can include hydrogen fluoride (HF). In some implementations, the fluorine-based etchant includes an HF vapor etchant or HF wet clean. In some implementations, selectively etching the oxide material of the oxide layer occurs at an etch contrast of at least 10:1 relative to the other materials of the mold stack, or at least 10:1 relative to the dielectric layer of the mold stack. "Etch contrast" may correspond to a ratio of etch rates between materials during an etch operation, where an etch contrast of 5:1 refers to an etch rate of a first material that is 5 times faster than a second material.

In some implementations, selectively etching at least a portion of the oxide layer to form a recessed region also results in a protrusion being defined in each film stack in areas outside the recessed region. Each "protrusion" results from portions of the sidewalls receding, including sidewalls from the oxide layer receding, where remaining portions of the sidewalls that did not recede from the selective etch define the protrusions. A protrusion from the sidewalls defines a lateral overhang of one or more materials from the mold stack over the recessed region. Areas outside the recessed region constitute a non-recessed region in the one or more features. The protrusion may laterally protrude into the one or more features by an amount equal to the thickness of the oxide layer removed. The protrusion may include at least the dielectric layer of the mold stack. In some instances, selective etching of the oxide layer may also remove some of the source region and drain region so that the source region and the drain region are not necessarily part of the protrusion. In some implementations, the protrusion may include the dielectric layer, the source region, and the drain region of the mold stack. In some implementations, the protrusion may include the dielectric layer, the source region, the drain region, and the conductor layer of the mold stack.

FIG. 5B shows a cross-sectional schematic illustration of the etched feature of FIG. 5A, where a recessed region is formed by selectively etching a portion of the oxide layer from sidewalls of the etched feature. A recessed region 520 is defined in each film stack 510 by lateral removal of a portion of the oxide layer 513 from sidewalls of the etched feature 516. The recessed region 520 may be formed by a horizontal etch. In some implementations, the recessed region 520 is a lateral recess produced by a selective wet or dry etch. The selective wet or dry etch removes oxide material of the oxide layer 513 substantially faster rate compared to materials of the source region 511, the drain region 512, the conductor layer 514, and the dielectric layer 515 of the mold stack 500. Thus, the selective wet or dry etch is selective to the source region 511, the drain region 512, the conductor layer 514, the dielectric layer 515 but nonselective to the oxide layer 513. The oxide layer 513 is partially etched in a lateral direction without substantially etching the dielectric layer 515. In some implementations, the oxide layer 513 is partially etched in a lateral direction without substantially etching the source region 511, the drain region 512, the conductor layer 514, and the dielectric layer 515. A protrusion 517 is defined after selectively etching a portion of the oxide layer 513 from sidewalls of the etched feature 516, where remaining materials from unetched sidewalls laterally protrude over the recessed region 520 to define the protrusion 517. As shown in FIG. 5B, the protrusion 517 can include the source region 511, the drain region 512, the conductor layer 514, and the dielectric layer 515.

Returning to FIG. 4, at block 430 of the process 400, a channel material is conformally deposited along sidewalls of the one or more features. In some implementations, the channel material may be deposited by atomic layer deposition (ALD) or chemical vapor deposition (CVD). In some implementations, the channel material may be a suitable semiconducting material such as polysilicon, silicon, germanium, silicon-germanium, carbon, boron nitride, molybdenum disulfide, or oxide semiconducting material such as indium gallium zinc oxide (IGZO). For example, the channel material can include lightly-doped polysilicon. In some implementations, an average thickness of the channel material is equal to or less than about 30 nm, equal to or less than about 20 nm, equal to or less than about 15 nm, or between about 2 nm and about 15 nm. The channel material is deposited in the recessed region on exposed surfaces of the oxide layer and also deposited on exposed surfaces of at least the source region, the drain region, and the dielectric layer. In some implementations, the channel material is further deposited on exposed surfaces of the conductor layer. The channel material is continuous or conformal along the mold stack in the one or more features.

FIG. 5C shows a cross-sectional schematic illustration of the etched feature of FIG. 5B, where channel material is conformally deposited along sidewalls of the etched feature. Channel material 530 is formed along sidewalls of the etched feature 516 and is continuous along sidewalls of the etched feature 516. The channel material 530 lines the sidewalls of the etched feature 516 without substantially filling the etched feature 516. The channel material 530 is formed in the recessed region 520 on the oxide layer 513. The channel material 530 is also formed on the source region 511, the drain region 512, the conductor layer 514, and the dielectric layer 515 of each film stack 510. In some implementations, the channel material 530 includes polysilicon. In some implementations, the channel material 530 includes silicon, germanium, silicon-germanium, carbon, boron nitride, molybdenum disulfide, or indium gallium zinc oxide.

Returning to FIG. 4, at block 440 of the process 400, a sacrificial liner is deposited covering the channel material along the sidewalls of the one or more features. The sacrificial liner may be composed of a material having a different etch selectivity than the channel material. Put another way, the sacrificial liner has a large etch contrast relative to the channel material. For example, the sacrificial liner may have an etch contrast of at least 10:1, at least 20:1, at least 30:1, or at least 50:1 relative to the channel material when exposed to a subsequent directional etch process.

In some implementations, the sacrificial liner includes carbon, silicon oxide, silicon nitride, germanium, or silicon-germanium. The sacrificial liner may include any material that can protect the channel material during etch and can be removed without damaging the underlying channel material. In some implementations, the sacrificial liner can be conformally deposited on the channel material such that a thickness of the sacrificial liner is substantially uniform along the sidewalls of the one or more features. However, in some other implementations, the sacrificial liner can be semi-conformally or nonconformally deposited on the channel material such that a thickness of the sacrificial liner is non-uniform along the sidewalls of the one or more features. In some implementations, an average thickness of the sacrificial liner is between about 1 nm and about 50 nm, between about 2 nm and about 20 nm, or between about 3 nm and about 15 nm.

The sacrificial liner may be etched easily by a subsequent directional etch process, such as an ion beam etch process or ion-enhanced chemical etch process discussed below. Thus, the sacrificial liner may be etched at a faster rate than underlying materials during the directional etch process, including the channel material and/or materials of the mold stack. However, the sacrificial liner may be selective to an isotropic etch process that selectively removes channel material. The isotropic etch process that follows the directional etch process removes the channel material at a faster rate than the sacrificial liner. The sacrificial liner comprises a material that is etched at a high etch contrast (e.g., at least 10:1) relative to the channel material during a subsequent directional etch process, but the channel material is etched at a high etch contrast (e.g., at least 10:1) relative to the material of the sacrificial liner during a subsequent isotropic etch process for selectively removing the channel material. The sacrificial liner serves to protect the channel material in the recessed region of the one or more features during the directional etch process and the isotropic etch process.

In some implementations, the sacrificial liner includes multiple layers of materials. For example, the multiple layers of materials may serve to facilitate removal of the sacrificial liner from the sidewalls of the one or more features. In some implementations, the sacrificial liner includes a bi-layer of an oxide and a carbide. The oxide may adhere to the channel material and the carbide may be disposed on the oxide. The oxide may be easily stripped and lifted off from the channel material during an oxygen-based strip, thereby facilitating removal of the sacrificial liner. For example, the oxide may include silicon oxide and the carbide may include silicon carbide.

FIG. 5D shows a cross-sectional schematic illustration of the etched feature of FIG. 5C, where a sacrificial liner is deposited on the channel material of the etched feature. The sacrificial liner 540 is deposited conformally or semi-conformally along the sidewalls of the etched feature 516. The sacrificial liner 540 is continuous along the mold stack 500 in the one or more features 516. The sacrificial liner 540 covers the channel material 530 to protect the channel material 530 from damage (e.g., excess over-etching of channel material 530) in the recessed region 520 during etching. The sacrificial liner 540 includes a material having a different etch selectivity than the channel material 530. In some implementations, the sacrificial liner 540 includes an oxide, a carbide, or combinations thereof. For example, the sacrificial liner 540 includes a bi-layer of an oxide and a carbide.

Returning to FIG. 4, at block 450 of the process 400, the sacrificial liner covering the channel material is etched in areas outside the recessed region. However, the sacrificial liner covering the channel material in the recessed region remains intact. Removal of the sacrificial liner in the areas outside the recessed region may be performed by a directional etch. The directional etch may provide etchant through the one or more features "vertically" while minimizing etchant penetrating "horizontally" in the recessed region. Protrusions from the sidewalls of the one or more features may serve as a mask to protect the recessed region during the directional etching of the sacrificial liner. The protrusions prevent etchant from etching materials in the recessed region, where the materials in the recessed region include the channel material. Such protrusions include layers of the mold stack above each recessed region, where the protrusions are located in the areas outside the recessed region. The protrusions include layers of the mold stack that laterally protrude from sidewalls of the one or more features. The protrusions act as an overhang to mask the sacrificial liner and the channel material in the recessed region during the directional etch. In some implementations, the protrusions may include at least the dielectric layer of the mold stack. Non-recessed region or areas outside the recessed region may include the protrusions. In some implementations, the recessed region may include at least the oxide layer of the mold stack.

In some implementations, the directional etch may include ionized chemical species or ionized plasma species, where an electromagnetic field is applied to direct the ionized chemical species or ionized plasma species toward a bottom of one or more features. Accordingly, the directional etch may be performed by ion beam etching (IBE) or ion enhanced chemical etching. However, it will be understood that other suitable etch techniques may be applied with directionality, where reactive species are generally accelerated or otherwise delivered toward the bottom of the one or more features. In some implementations, a Kiyo™ reactor, produced by Lam Research Corporation of Fremont, CA, is an example of a suitable reactor that may be used to perform the directional etch.

The protrusions in the one or more features act as a mask to block the reactive species from etching the sacrificial liner and the channel material in the recessed region. However, during the directional etch, the sacrificial liner deposited along the protrusions is etched at a high etch contrast relative to the channel material. In some implementations, the sacrificial liner is etched at an etch contrast of at least 10:1, at least 20:1, at least 30:1, or at least 50:1 relative to the channel material during the directional etch. The directional etch is performed until all of the sacrificial liner is removed from the protrusions of the one or more features, meaning that all of the sacrificial liner is removed from the areas outside the recessed region while leaving the sacrificial liner and channel material intact in the recessed region. The sacrificial liner is removed without breaching or eroding material from the protrusions. This effectively opens up the one or more features with minimal loss of material in the mold stack or the channel material. As used herein, minimal loss of material can refer to about 10% or less loss of material. In some implementations, a top of the mold stack may include an oxide layer or other mask layer to serve as a mask during the directional etch. The mask layer may include, for example, an oxide material of the oxide layer lined with the channel material and sacrificial liner. The sacrificial liner is removed from the mask layer without breaching or eroding the oxide material of the mask layer.

Figures 5E, 5F, 5G:
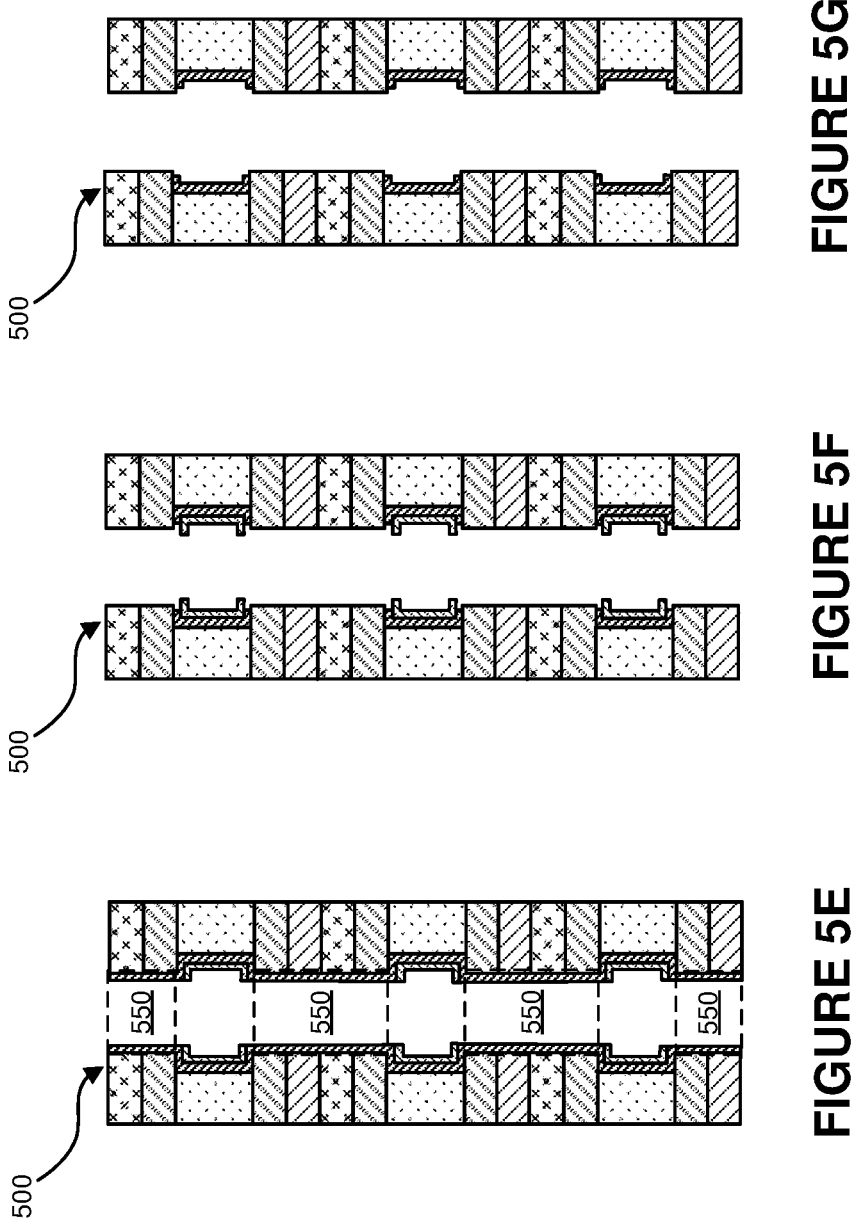

FIG. 5E shows a cross-sectional schematic illustration of the etched feature of FIG. 5D, where the sacrificial liner is removed from a non-recessed region by a directional etch. A directional etch is applied vertically through the etched feature 516 to open up the etched feature 516 in the non-recessed region 550. Specifically, the directional etch removes the sacrificial liner 540 along protrusions 517 that laterally protrude in the etched feature 516, where the protrusions 517 laterally protrude in the non-recessed region 550 of the etched feature 516. The directional etch is selective to the channel material and nonselective to the sacrificial liner. Hence, the directional etch largely does not remove the channel material 530 along the protrusions 517. Furthermore, the channel material 530 and the sacrificial liner 540 are not etched in the recessed region 520 of the etched feature 516 following the directional etch. The protrusions 517 in the non-recessed region 550 act as a mask to prevent etching in the recessed region 520 during the directional etch.

Returning to FIG. 4, at block 460 of the process 400, the channel material is selectively etched along the sidewalls of the one or more features in the areas outside of the recessed region to define an isolated channel layer between the source region and the drain region of each film stack. The channel material in the recessed region remains intact while the channel material outside the recessed region is removed. Removal of the channel material in the areas outside the recessed region is performed by an isotropic etch that is selective to the sacrificial liner and the mold stack. The isotropic etch may provide etchant through the one or more features non-directionally (i.e., "vertically" and "horizontally"), where the etchant interacts with exposed materials along the sidewalls of the one or more features. The sacrificial liner in the recessed region protects the channel material from being etched in the recessed region.

During the isotropic etch, the channel material is etched at a high etch contrast relative to the sacrificial liner and the mold stack. In some implementations, the channel material is etched at an etch contrast of at least 25:1, at least 50:1, at least 75:1, or at least 100:1 relative to the sacrificial liner during the isotropic etch. In some implementations, the channel material is etched at an etch contrast of at least 10:1, at least 20:1, at least 30:1, or at least 50:1 relative to the mold stack during the isotropic etch, or at least relative to the dielectric layer of the mold stack during the isotropic etch. The mold stack includes materials in the source region, drain region, dielectric layer, and/or conductor layer. In some implementations, the isotropic etch includes a wet etch, where a chemistry of the wet etch can depend on the semiconducting material of the channel material being removed. In some implementations, the isotropic etch includes a plasma etch, where a chemistry of the plasma etch can depend on the semiconducting material of the channel material being removed. The chemistry of the isotropic etch depends on the channel material being removed. In one example, a fluorine-based etchant such as hydrogen fluoride (HF) may be used for removal of an oxide semiconducting material. In another example, peroxide may be used for removal of germanium. Or, hydrogen-based plasma or fluorine-based plasma may be used for removal of germanium or silicon-germanium. In yet another example, atomic layer etching processes may be employed for removal of various oxide materials.

Channel material deposited along protrusions that laterally protrude in the one or more features is etched by the isotropic etch. However, the sacrificial liner and channel material in the recessed region of each film stack remain intact or at least substantially remain intact after the isotropic etch. In some implementations, a small portion of the channel material in the recessed region is etched, where the small portion may constitute some of the channel material deposited along surfaces of the source region and the drain region in the recessed region. However, for each film stack, the channel material is continuous along a surface of at least the oxide layer in the recessed region, providing connection between the source region and the drain region. This channel material in the recessed region defines the isolated channel layer. The channel material is discontinuous between adjacent film stacks, meaning that the channel material is not connected (i.e., isolated) between memory cells in a memory array. In other words, the channel material is only in contact with the source region and the drain region of the corresponding film stack. The sidewalls of the one or more features in the areas outside the recessed region are substantially free of channel material.

FIG. 5F shows a cross-sectional schematic illustration of the etched feature of FIG. 5E, where channel material is removed from the non-recessed region by an isotropic etch. An isotropic etch is applied in the etched feature 516 to remove channel material 530 from the non-recessed region 550 of the etched feature 516. Specifically, the isotropic etch removes the channel material 530 along protrusions 517 that laterally protrude in the etched feature 516. In some implementations, the channel material 530 is removed from the dielectric layer 515 of the mold stack 500. The isotropic etch is selective to the sacrificial liner 540 and to the mold stack 500 but nonselective to the channel material 530. However, the isotropic etch does not remove the channel material 530 in the recessed region 520 of the etched feature 516, or at least does not remove the channel material 530 in the recessed region 520 on the oxide layer 513 spanning between the source region 511 and the drain region 512 due to the presence of the sacrificial liner 540. The sacrificial liner 540 is not etched in the recessed region 520 of the etched feature 516, but serves as a protective layer to prevent the channel material 530 from getting etched in the recessed region 520. The channel material 530 in the recessed region 520 is isolated for each film stack 510, thereby forming a channel layer.

Returning to FIG. 4, the process 400 further includes removing the sacrificial liner overlying the isolated channel layer. The sacrificial liner is removed after selectively etching the channel material from the areas outside the recessed region. In some implementations, the sacrificial liner is removed by a plasma etch or wet etch process. In some implementations, the plasma etch or wet etch may be selective towards the isolated channel layer but nonselective towards one or more materials of the sacrificial liner. For example, the plasma etch or wet etch process can target one or more materials of the sacrificial liner such as an oxide material for lift-off from the channel material, thereby removing the entirety of the sacrificial liner. This leaves the isolated channel layer in each film stack exposed in the one or more features. The isolated channel layer is insulated from adjacent film stacks to avoid electrical shorting by unwanted electrical interconnection between memory cells. The isolated channel layer undergoes minimal loss of channel material. Minimal loss of channel material can be achieved by preserving a sufficient amount of the channel material so that an average thickness of the isolated channel layer is at least 5 nm, between about 5 nm and about 30 nm, or between about 5 nm and about 20 nm. In some implementations, etch operations such as the directional etch at block 450 and the isotropic etch at block 460 do not damage the isolated channel layer in that there are no resulting significant topological differences, non-uniformities, or discontinuities along the isolated channel layer. In some implementations, the isolated channel layer can have topographical deviations no greater than about 10% from a reference surface. The isolated channel layer can be continuous between the source region and drain region with direct contact with the source region and drain region. In some implementations, the isolated channel layer has an average thickness equal to or greater than about 5 nm after removal of the sacrificial liner. For example, the isolated channel layer is between about 5 nm and about 20 nm in average thickness.

With the isolated channel layer exposed in the one or more features, subsequent deposition and patterning operations may be performed in the one or more features to complete fabrication of a vertically integrated three-terminal memory array. In some implementations, materials in a memory film stack may be deposited on the isolated channel layer of each film stack, where the materials in the memory film stack can include a ferroelectric layer as shown in FIG. 2A, a charge trap layer as shown in FIG. 2B, or a spin-orbit torque stack as shown in FIG. 2C. Furthermore, in some implementations, a gate electrode or gate terminal may be deposited on the memory film stack and aligned with isolated channel layer, where the memory film stack is between the isolated channel layer and the gate terminal. In addition, in some implementations, a source terminal may be deposited on the source region to connect to the source region and a drain terminal may be deposited on the drain region to connect to the drain region. A vertically integrated three-terminal memory array may be fabricated in the one or more features by 3-D vertical stacking in the present disclosure, where the channel layer in each memory cell of the memory array is electrically isolated and free of damage (e.g., minimal loss of channel material).

FIG. 5G shows a cross-sectional schematic illustration of the etched feature of FIG. 5F, where the sacrificial liner is removed. A dry clean or wet clean operation may be applied to remove the sacrificial liner 540 from the etched feature 516. The dry clean or wet clean operation removes the sacrificial liner 540 off of the channel material 530 in the recessed region 520, leaving the channel material 530 exposed in the recessed region 520. Minimal loss of channel material 530 occurs after removal of the sacrificial liner 540. The channel material 530 is continuous along the oxide layer 513 between the source region 511 and the drain region 512 for each film stack 510, resulting in an isolated channel layer. The channel material 530 provides contact with the source region 511 and the drain region 512.

Figures 6A, 6B, 6C, 6D, 6E:
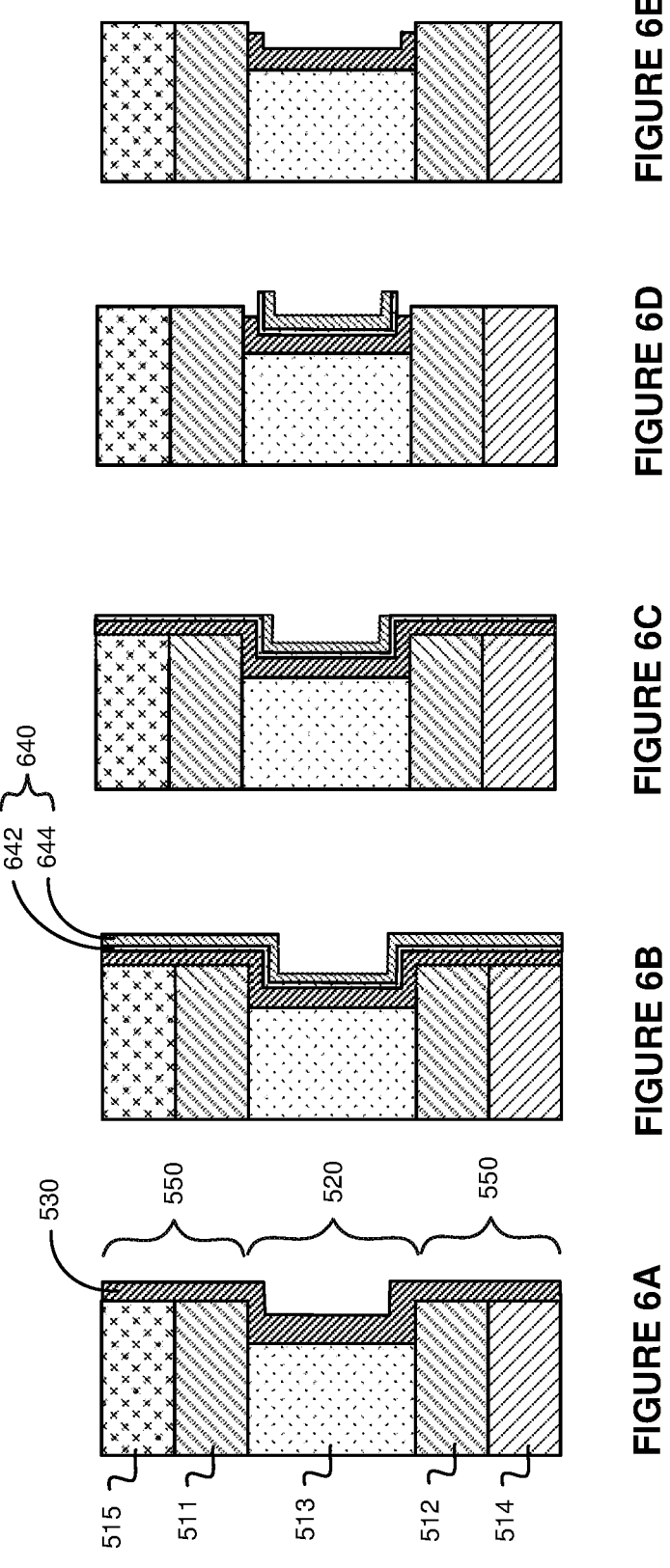
FIGS. 6A-6E show cross-sectional schematic illustrations of magnified views of various stages in an example process of forming an isolated channel layer using a multi-layered sacrificial liner according to some implementations.

FIGS. 6A-6E show cross-sectional schematic illustrations of magnified views of various stages in an example process of forming an isolated channel layer using a multi-layered sacrificial liner according to some implementations. A channel material 530 is deposited along sidewalls of an etched feature 516 of a mold stack 500 as shown in FIG. 6A. Rather than depositing a sacrificial liner composed of a single material, a multi-layered sacrificial liner 640 is deposited on the channel material 530 as shown in FIG. 6B. The multi-layered sacrificial liner 640 includes a first layer of oxide 642 deposited on the channel material 530 followed by a second layer of carbon 644 deposited on the first layer of oxide 642. The first layer of oxide 642 interfaces with the channel material 530 and the second layer of carbon 644 is exposed. After a directional etch that is selective towards the channel material 530, at least the second layer of carbon 644 is removed from areas outside a recessed region 520 (i.e., non-recessed region 550) as shown in FIG. 6C. After an isotropic etch that is selective towards the second layer of carbon 644, at least the first layer of oxide 642 and the channel material 530 are removed from the non-recessed region 550 as shown in FIG. 6D. Due to the protection of the second layer of carbon 644 and the first layer of oxide 642, and the channel material 530 largely remain intact in the recessed region 520. After a lift-off operation that targets the first layer of oxide 642, the first layer of oxide 642 and the second layer of carbon 644 are removed from the recessed region 620, thereby removing the multi-layered sacrificial liner 640 in FIG. 6E. The channel material 530 is left exposed in the recessed region 520 after the lift-off operation in FIG. 6E.

Apparatus

Figure 7:
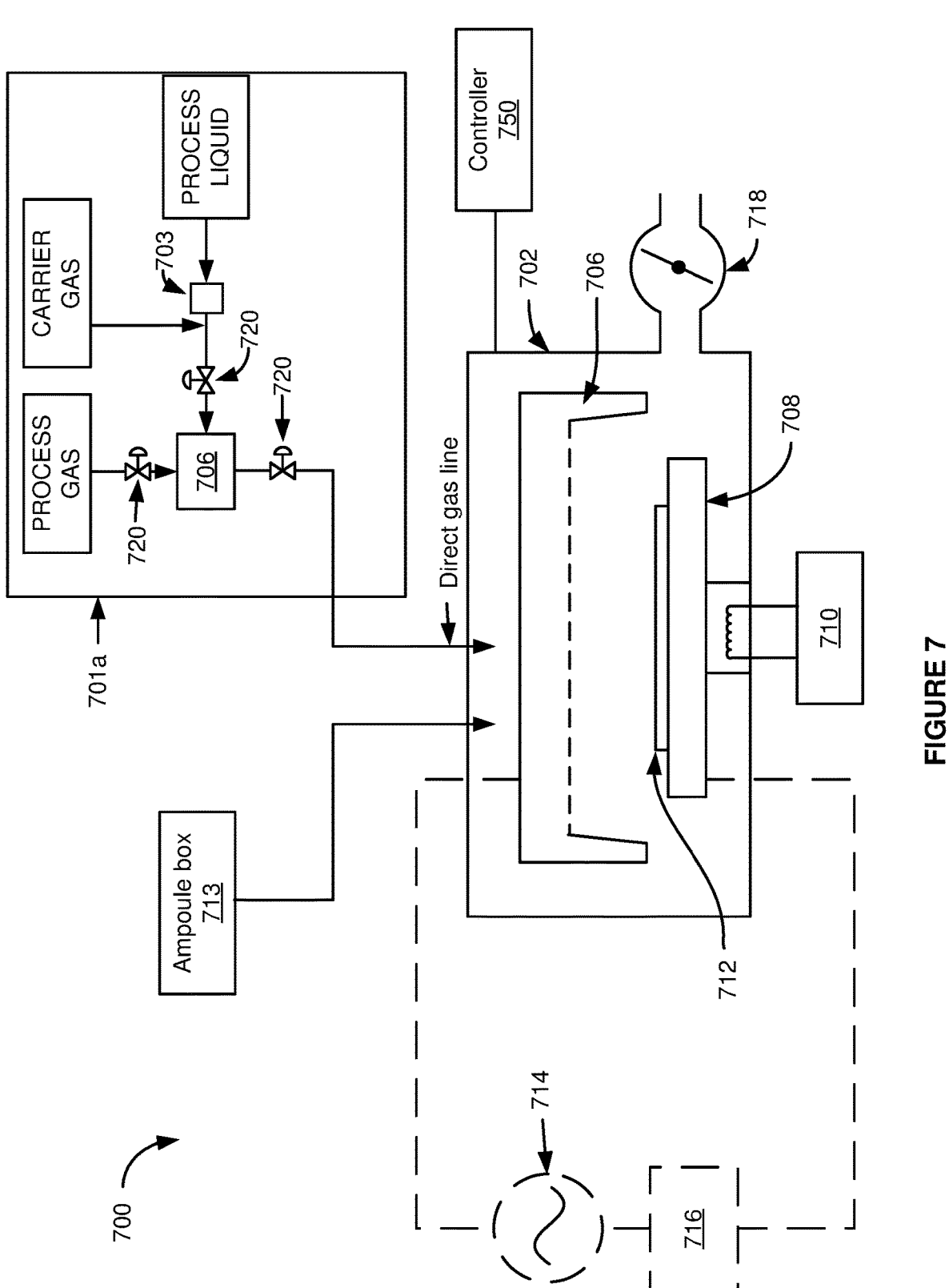
FIG. 7 illustrates a schematic diagram of an example process chamber for performing one or more operations of the disclosed implementations.

FIG. 7 depicts a schematic illustration of an embodiment of an atomic layer deposition (ALD) and/or chemical vapor deposition (CVD) process station 700 having a process chamber body 702 for maintaining a low-pressure environment. A plurality of process stations 700 may be included in a common low pressure process tool environment. For example, FIG. 14 depicts an example embodiment of a multi-station processing tool. In some embodiments, one or more hardware parameters of ALD process station 700 including those discussed in detail below may be adjusted programmatically by one or more computer controllers 750.

Process station 700 fluidly communicates with reactant delivery system 701a for delivering process gases to a distribution showerhead 706. Reactant delivery system 701a includes a mixing vessel 704 for blending and/or conditioning process gases, such as a silicon precursor gas, or second reactant gas (e.g., an oxygen-containing reactant, carbon-containing reactant, etc.), for delivery to showerhead 706. One or more mixing vessel inlet valves 720 may control introduction of process gases to mixing vessel 704. Plasma may also be delivered to the showerhead 706 or may be generated in the process station 700. Reactant delivery system 701a may be configured to deliver process gases to a substrate provided in the process station 700.

As an example, the embodiment of FIG. 7 includes a vaporization point 703 for vaporizing liquid reactant to be supplied to the mixing vessel 704. In some embodiments, vaporization point 703 may be a heated vaporizer. The saturated reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve purging and/or evacuating the delivery piping to remove residual reactant. However, purging the delivery piping may increase process station cycle time, degrading process station throughput. Thus, in some embodiments, delivery piping downstream of vaporization point 703 may be heat traced. In some examples, mixing vessel 704 may also be heat traced. In one non-limiting example, piping downstream of vaporization point 703 has an increasing temperature profile extending from approximately 100° C. to approximately 150° C. at mixing vessel 704.

In some embodiments, liquid precursor or liquid reactant may be vaporized at a liquid injector. For example, a liquid injector may inject pulses of a liquid reactant into a carrier gas stream upstream of the mixing vessel. In one embodiment, a liquid injector may vaporize the reactant by flashing the liquid from a higher pressure to a lower pressure. In another example, a liquid injector may atomize the liquid into dispersed microdroplets that are subsequently vaporized in a heated delivery pipe. Smaller droplets may vaporize faster than larger droplets, reducing a delay between liquid injection and complete vaporization. Faster vaporization may reduce a length of piping downstream from vaporization point 703. In one scenario, a liquid injector may be mounted directly to mixing vessel 704. In another scenario, a liquid injector may be mounted directly to showerhead 706.

In some embodiments, a liquid flow controller (LFC) upstream of vaporization point 703 may be provided for controlling a mass flow of liquid for vaporization and delivery to process station 700. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, this may be performed by disabling a sense tube of the LFC and the PID controller.

Showerhead 706 distributes process gases toward substrate 712. In the embodiment shown in FIG. 7, the substrate 712 is located beneath showerhead 706 and is shown resting on a pedestal 708. Showerhead 706 may have any suitable shape, and may have any suitable number and arrangement of ports for distributing process gases to substrate 712.

In some embodiments, pedestal 708 may be raised or lowered to expose substrate 712 to a volume between the substrate 712 and the showerhead 706. It will be appreciated that, in some embodiments, pedestal height may be adjusted programmatically by a suitable computer controller 750.

In another scenario, adjusting a height of pedestal 708 may allow a plasma density to be varied during plasma activation cycles in the process in embodiments where a plasma is ignited. At the conclusion of the process phase, pedestal 708 may be lowered during another substrate transfer phase to allow removal of substrate 712 from pedestal 708.

In some embodiments, pedestal 708 may be temperature controlled via heater 710. In some embodiments, the pedestal 708 may be heated to a temperature of at least about 250° C., or in some embodiments, less than about 300° C., such as about 250° C., during deposition of the channel material and/or sacrificial liner as described in disclosed embodiments. In some embodiments, the pedestal is set at a temperature between about 50° C. and about 300° C., such as at a temperature between about 200° C. and about 275° C. In some embodiments, the pedestal is set at a temperature between about 50° C. and about 300° C. In some embodiments, the pedestal is set at a temperature between about 200° C. and about 275° C.

Further, in some embodiments, pressure control for process station 700 may be provided by butterfly valve 718. As shown in the embodiment of FIG. 7, butterfly valve 718 throttles a vacuum provided by a downstream vacuum pump (not shown). However, in some embodiments, pressure control of process station 700 may also be adjusted by varying a flow rate of one or more gases introduced to the process station 700.

In some embodiments, a position of showerhead 706 may be adjusted relative to pedestal 708 to vary a volume between the substrate 712 and the showerhead 706. Further, it will be appreciated that a vertical position of pedestal 708 and/or showerhead 706 may be varied by any suitable mechanism within the scope of the present disclosure. In some embodiments, pedestal 708 may include a rotational axis for rotating an orientation of substrate 712. It will be appreciated that, in some embodiments, one or more of these example adjustments may be performed programmatically by one or more suitable computer controllers 750.

In some embodiments where plasma may be used as discussed above, showerhead 706 and pedestal 708 electrically communicate with a radio frequency (RF) power supply 714 and matching network 716 for powering a plasma. In some embodiments, the plasma energy may be controlled by controlling one or more of a process station pressure, a gas concentration, an RF source power, an RF source frequency, and a plasma power pulse timing. For example, RF power supply 714 and matching network 716 may be operated at any suitable power to form a plasma having a particular composition of radical species. Examples of suitable powers are included above. Likewise, RF power supply 714 may provide RF power of any suitable frequency. In some embodiments, RF power supply 714 may be configured to control high- and low-frequency RF power sources independently of one another. Example low-frequency RF frequencies may include, but are not limited to, frequencies between 0 kHz and 500 kHz. Example high-frequency RF frequencies may include, but are not limited to, frequencies between 1.8 MHz and 2.45 GHz, or greater than about 13.56 MHz, or greater than 27 MHz, or greater than 180 MHz, or greater than 60 MHz. It will be appreciated that any suitable parameters may be modulated discretely or continuously to provide plasma energy for the surface reactions.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, instructions for a controller 750 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, a first recipe phase may include instructions for setting a flow rate of an inert and/or a reactant gas (e.g., the first precursor such as a silicon precursor), instructions for setting a flow rate of a carrier gas (such as argon), and time delay instructions for the first recipe phase. A second, subsequent recipe phase may include instructions for modulating or stopping a flow rate of an inert and/or a reactant gas, and instructions for modulating a flow rate of a carrier or purge gas and time delay instructions for the second recipe phase. A third recipe phase may include instructions for modulating a flow rate of a second reactant gas, instructions for modulating the flow rate of a carrier or purge gas, and time delay instructions for the third recipe phase. A fourth, subsequent recipe phase may include instructions for modulating or stopping a flow rate of an inert and/or a reactant gas, and instructions for modulating a flow rate of a carrier or purge gas and time delay instructions for the fourth recipe phase. It will be appreciated that these recipe phases may be further subdivided and/or iterated in any suitable way within the scope of the disclosed embodiments.

Figure 8:
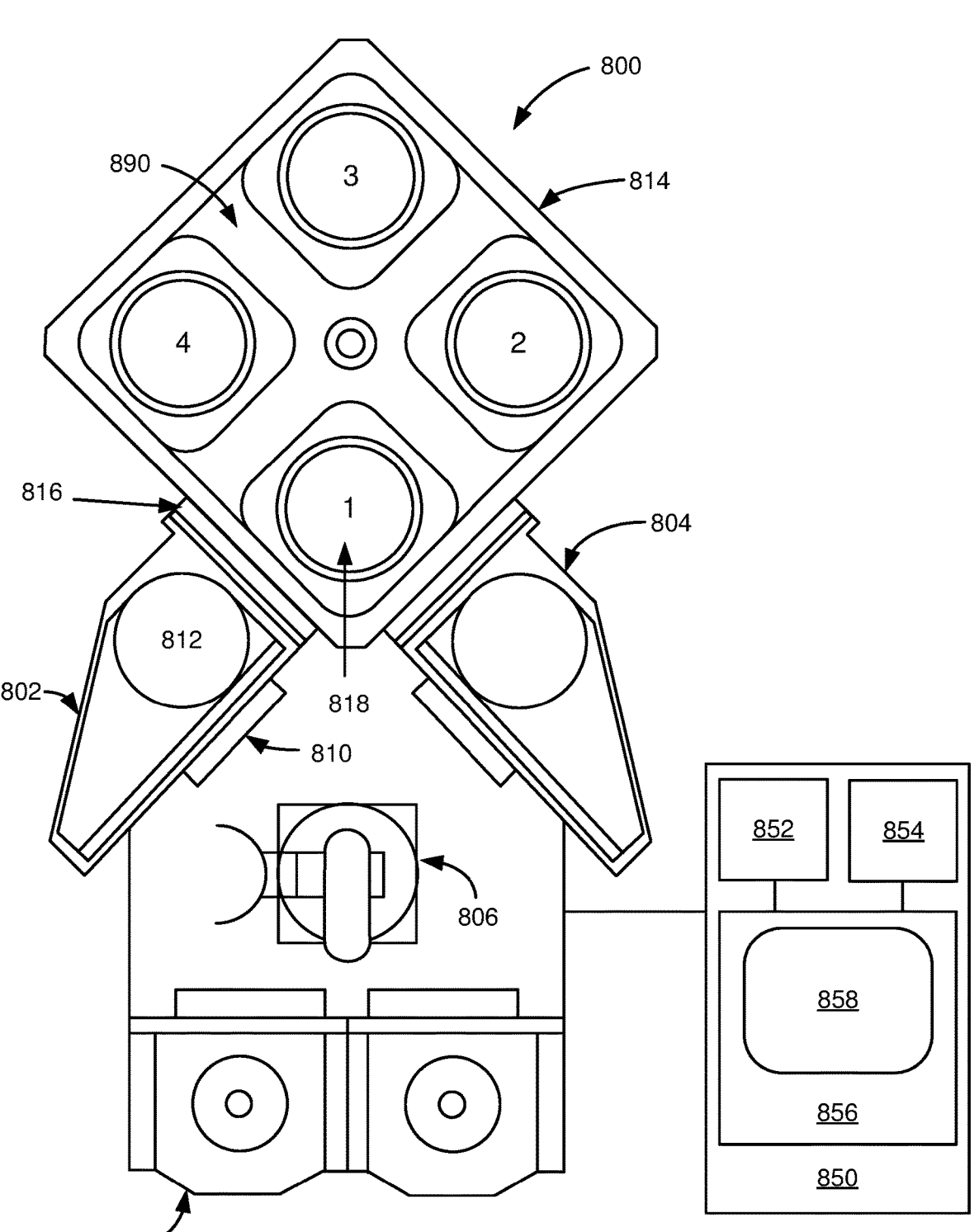
FIG. 8 illustrates a schematic diagram of an example process tool for performing one or more operations of the disclosed implementations.

As described above, one or more process stations may be included in a multi-station processing tool. FIG. 8 shows a schematic view of an embodiment of a multi-station processing tool 800 with an inbound load lock 802 and an outbound load lock 804, either or both of which may include a remote plasma source. A robot 806 at atmospheric pressure is configured to move wafers from a cassette loaded through a pod 808 into inbound load lock 802 via an atmospheric port 810. A wafer is placed by the robot 806 on a pedestal 812 in the inbound load lock 802, the atmospheric port 810 is closed, and the load lock is pumped down. Where the inbound load lock 802 includes a remote plasma source, the wafer may be exposed to a remote plasma treatment in the load lock prior to being introduced into a processing chamber 814. Further, the wafer also may be heated in the inbound load lock 802 as well, for example, to remove moisture and adsorbed gases. Next, a chamber transport port 816 to processing chamber 814 is opened, and another robot (not shown) places the wafer into the reactor on a pedestal of a first station shown in the reactor for processing. While the embodiment depicted in FIG. 8 includes load locks, it will be appreciated that, in some embodiments, direct entry of a wafer into a process station may be provided.

The depicted processing chamber 814 includes four process stations, numbered from 1 to 4 in the embodiment shown in FIG. 8. Each station has a heated pedestal (shown at 818 for station 1), and gas line inlets. It will be appreciated that in some embodiments, each process station may have different or multiple purposes. For example, in some embodiments, a process station may be switchable between an ALD and plasma-enhanced ALD process mode.

Additionally or alternatively, in some embodiments, processing chamber 814 may include one or more matched pairs of ALD and plasma-enhanced ALD process stations. While the depicted processing chamber 814 includes four stations, it will be understood that a processing chamber according to the present disclosure may have any suitable number of stations. For example, in some embodiments, a processing chamber may have five or more stations, while in other embodiments a processing chamber may have three or fewer stations.

FIG. 8 depicts an embodiment of a wafer handling system 890 for transferring wafers within processing chamber 814. In some embodiments, wafer handling system 890 may transfer wafers between various process stations and/or between a process station and a load lock. It will be appreciated that any suitable wafer handling system may be employed. Non-limiting examples include wafer carousels and wafer handling robots.

It will be appreciated that, in some embodiments, a low-pressure transfer chamber may be included in a multi-station processing tool to facilitate transfer between a plurality of processing chambers. In the embodiment shown in FIG. 8, multi-station processing tool 800 includes a plurality of processing chambers 814 including a plurality of process stations (numbered 1 through 4). Processing chambers 814 are interfaced with a low-pressure transport chamber including a robot 806 configured to transport substrates between processing chambers 814 and load lock. An atmospheric substrate transfer module 810, including an atmospheric robot, is configured to facilitate transfer of substrates between load lock and pod 808.

FIG. 8 also depicts an embodiment of a system controller 850 employed to control process conditions and hardware states of process tool 800. System controller 850 may include one or more memory devices 856, one or more mass storage devices 854, and one or more processors 852. Processor 852 may include a CPU or computer, analog, and/or digital input/output connections, stepper motor controller boards, etc.

In some embodiments, system controller 850 controls all of the activities of process tool 800. System controller 850 executes system control software 858 stored in mass storage device 854, loaded into memory device 856, and executed on processor 852. Alternatively, the control logic may be hard coded in the controller 850. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 858 may include instructions for controlling the timing, mixture of gases, gas flow rates, chamber and/or station pressure, chamber and/or station temperature, wafer temperature, target power levels, RF power levels, substrate pedestal, chuck and/or susceptor position, and other parameters of a particular process performed by process tool 800. System control software 858 may be configured in any suitable way. For example, various process tool component subroutines or control objects may be written to control operation of the process tool components used to carry out various process tool processes. System control software 858 may be coded in any suitable computer readable programming language.

In some embodiments, system control software 858 may include input/output control (IOC) sequencing instructions for controlling the various parameters described above. Other computer software and/or programs stored on mass storage device 854 and/or memory device 856 associated with system controller 850 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 818 and to control the spacing between the substrate and other parts of process tool 800.

A process gas control program may include code for controlling gas composition (e.g., silicon precursor gases, and carbon-containing gases, carrier gases and purge gases as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with system controller 850. The user interface may include a display screen, graphical software displays of the apparatus and/or process conditions, and user input devices such as pointing devices, keyboards, touch screens, microphones, etc.

In some embodiments, parameters adjusted by system controller 850 may relate to process conditions. Non-limiting examples include process gas composition and flow rates, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of system controller 850 from various process tool sensors. The signals for controlling the process may be output on the analog and digital output connections of process tool 800. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 850 may provide program instructions for implementing the above-described deposition processes. The program instructions may control a variety of process parameters, such as DC power level, RF bias power level, pressure, temperature, etc. The instructions may control the parameters to operate deposition of film stacks according to various embodiments described herein.

The system controller 850 will typically include one or more memory devices and one or more processors configured to execute the instructions so that the apparatus will perform a method in accordance with disclosed embodiments. Machine-readable media containing instructions for controlling process operations in accordance with disclosed embodiments may be coupled to the system controller 850.

In some implementations, the system controller 850 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 850, depending on the processing conditions and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 850 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 850 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller 850, in some implementations, may be a part of or coupled to a computer that is integrated with, coupled to the system, otherwise networked to the system, or a combination thereof. For example, the system controller 850 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 850 receives instructions in the form of data, which specify parameters for each of the processing steps to be performed during one or more operations. It should be understood that the parameters may be specific to the type of process to be performed and the type of tool that the system controller 850 is configured to interface with or control. Thus as described above, the system controller 850 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the system controller 850 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

CONCLUSION

In the foregoing description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments are described in conjunction with the specific embodiments, it will be understood that it is not intended to limit the disclosed embodiments.

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of forming an isolated channel layer comprising:
   (i) etching one or more features through a mold stack, the mold stack comprising a plurality of film stacks, wherein the plurality of film stacks is vertically stacked and adjacent film stacks are separated by a dielectric layer, each film stack comprising: a source region, a drain region, and an oxide layer between the source region and the drain region;
   (ii) selectively etching at least a portion of the oxide layer in each of the film stacks to form a recessed region in each of the film stacks;
   (iii) depositing a channel material conformally along sidewalls of the one or more features;
   (iv) depositing a sacrificial liner covering the channel material along the sidewalls of the one or more features;
   (v etching the sacrificial liner covering the channel material in areas outside the recessed region;
   (vi) selectively etching at least the channel material along the sidewalls of the one or more features outside the recessed region to define an isolated channel layer between the source region and the drain region of each film stack; and
   (vii) removing, after selectively etching at least the channel material outside the recessed region, an entirety of the sacrificial liner overlying the isolated channel layer.

2. The method of claim 1, wherein the isolated channel layer has topographical deviations no greater than about 10% from a reference surface after removing the sacrificial liner.

3. The method of claim 1, wherein each film stack further comprises a conductor layer adjacent to the drain region and sandwiched between the drain region and the dielectric layer, wherein the dielectric layer serves to electrically isolate the adjacent film stacks from one another.

4. The method of claim 1, wherein etching the sacrificial liner in the areas outside the recessed region comprises directionally etching the sacrificial liner at an etch contrast of at least 10:1 relative to the channel material.

5. The method of claim 4, wherein protrusions from the sidewalls of the one or more features serve as a mask to protect the recessed region during the directional etching of the sacrificial liner.

6. The method of claim 1, wherein selectively etching at least the channel material in the areas outside the recessed region comprises isotropically etching the channel material at an etch contrast of at least 25:1 relative to the sacrificial liner.

7. The method of claim 6, wherein isotropically etching the channel material occurs at an etch contrast of at least 10:1 relative to at least the dielectric layer.

8. The method of claim 1, wherein the channel material comprises a semiconducting material, and wherein the sacrificial liner comprises a bilayer of a carbide and oxide material.

9. The method of claim 8, wherein the semiconducting material comprises polysilicon, and wherein the sacrificial liner comprises a first layer of oxide disposed on the semiconducting material and a second layer of carbide disposed on the first layer of oxide.

10. The method of claim 1, wherein the sacrificial liner is conformally deposited on the channel material along the sidewalls of the one or more features.

11. The method of claim 1, wherein the plurality of film stacks comprises greater than 20 repeating film stacks.

12. The method of claim 1, wherein the sidewalls of the one or more features in the areas outside the recessed region are substantially free of channel material after selectively etching at least the channel material.

13. The method of claim 1, wherein an average thickness of the isolated channel layer is between about 5 nm and about 20 nm.

\* \* \* \* \*